(12) United States Patent
Goswami et al.

(10) Patent No.: US 11,334,691 B2
(45) Date of Patent: May 17, 2022

(54) DETECTION OF GAPS BETWEEN OBJECTS IN COMPUTER ADDED DESIGN DEFINED GEOMETRIES

(71) Applicant: Dassault Systemes Simulia Corp., Johnston, RI (US)

(72) Inventors: Samrat Goswami, Burlington, MA (US); Gennady Burenkov, Burlington, MA (US)

(73) Assignee: Dassault Systemes Simulia Corp., Johnston, RI (US)

( * ) Notice: Subject to any disclaimer, the term of this patent is extended or adjusted under 35 U.S.C. 154(b) by 373 days.

(21) Appl. No.: 16/504,599

(22) Filed: Jul. 8, 2019

(65) Prior Publication Data
US 2020/0034497 A1 Jan. 30, 2020

Related U.S. Application Data
(60) Provisional application No. 62/712,099, filed on Jul. 30, 2018.

(51) Int. Cl.
*G06F 30/00* (2020.01)
*G06F 30/10* (2020.01)

(52) U.S. Cl.
CPC .............. *G06F 30/00* (2020.01); *G06F 30/10* (2020.01); *G06T 2219/2021* (2013.01)

(58) Field of Classification Search
CPC .......... G06F 30/00; G06F 30/10; G06F 30/15; G06F 30/23; G06T 2219/2021; G06T 19/20
USPC .......................................................... 703/1
See application file for complete search history.

(56) References Cited

U.S. PATENT DOCUMENTS

| | | |
|---|---|---|
| 5,594,671 A | 1/1997 | Chen et al. |
| 7,558,714 B2 | 7/2009 | Shan et al. |
| 2004/0174362 A1* | 9/2004 | Celniker ............... G06T 17/30 345/441 |
| 2009/0322749 A1* | 12/2009 | Kassab ................ G06T 7/0012 345/424 |
| 2012/0029894 A1* | 2/2012 | Okutani ................ G06F 30/23 703/9 |
| 2013/0151221 A1 | 6/2013 | Chen et al. |
| 2016/0124117 A1* | 5/2016 | Huang .................... G06T 17/05 703/2 |

(Continued)

FOREIGN PATENT DOCUMENTS
JP H027173 A 1/1990

OTHER PUBLICATIONS

Penzkofer, F. et al., "Visual Analysis Method for Non-Ideal Assemblies", 2008, International Design Conference. (Year: 2008).*

(Continued)

*Primary Examiner* — Cedric Johnson
(74) *Attorney, Agent, or Firm* — Fish & Richardson P.C.

(57) ABSTRACT

A methods and computer systems can automatically identify and fill gaps in a computer aided design. One method includes identifying a first set of points on a first solid in a CAD design. The method includes identifying a second set of points on the second solid in the CAD design. The method also includes determining a volume of the gap between the first solid and the second solid based on a Delaunay tetrahedralization of the first set of points and the second set of points.

20 Claims, 14 Drawing Sheets

(56) References Cited

U.S. PATENT DOCUMENTS

2016/0152314 A1* 6/2016 Carlsten .................. B32B 37/16
244/119

OTHER PUBLICATIONS

Busaryev, Oleksiy et al. "Repairing and Meshing Imperfect Shapes with Delaunay Refinement", Oct. 4-9, 2009, SIAM/ACM Joint Conference on Geometric and Physical Modeling, ACM (Year: 2009).*
U.S. Appl. No. 11/463,673, filed Aug. 10, 2006, Xiaowen et al.
Penzkofer et al., "Visual analysis methods for non-ideal assemblies", Proceedings Design 2008, The 10th International Design Conference, May 19, 2008, 657-664.
Extended European Search Report in European Appln No. 19188922.9, dated Jul. 8, 2021, 4 pages.
Extended European Search Report in European Appln No. 21173809.1, dated Sep. 23, 2021, 11 pages.
Jansen et al., "HULK-Simple and fast generation of structured hexahedral meshes for improved subsurface simulations," Computers & Geosciences, Nov. 27, 2016, vol. 99, pp. 159-170.
Kakosimos et al., "An efficient 3D mesh generator based on geometry decomposition," Computers and Structures, Jan. 1, 2009, 87(1-2):27-38.
Tierney et al, [online] "Tolerant geometric extraction of fluid domains to assist CFD analyses of aero-engines," AIAA SciTech 2019 Forum, Jan. 7, 2019, retrieved on Sep. 14, 2021, retrieved from URL<https://www.researchgate.net/profile/Chris-Tierney-4/publication/330196763_Tolerant_geometric_extraction_of_fluid_domains_to_assist_CFD_analyses_of_aero-engines/links/5c3d9248299bf12be3c8b4cc/Tolerant-geometric-extraction-of-fluid-domains-to-assist-CFD-analyses-of-aero-engines.pdf>, 15 pages.
U.S. Appl. No. 11/463,673, Shan et al., filed Aug. 10, 2006.
EP Extended Search Report in European Appln. No. 19188922, dated Dec. 20, 2019, 10 pages.
Penzkofer et al., "Visual analysis methods for non-ideal assemblies", Proceedings of DESIGN 2008, the 10th International Design Conference, May 19-22, 2008, Dubrovnik, Croatia, DS48:657-664.

* cited by examiner

DETECTION OF GAPS BETWEEN OBJECTS IN COMPUTER ADDED DESIGN DEFINED GEOMETRIES

CLAIM OF PRIORITY

This application claims priority under 35 USC § 119(e) to U.S. Provisional Patent Application Ser. No. 62/712,099, filed on Jul. 30, 2018 and entitled "Detection of Gap between CAD Geometries," the entire contents of which are hereby incorporated by reference.

BACKGROUND

This disclosure relates to techniques to define geometries of objects.

Computer-aided design (CAD) is the use of computer systems to aid in the creation, modification, analysis, or optimization of a design. Computer-aided design (CAD) has many applications. One application of CAD is that CAD drawings can serve as a basis for defining object geometries for fluid flow simulations.

Computational fluid dynamics (CFD) is a branch of fluid mechanics that solves problems involving fluid flows. In some implementations, computer systems perform calculations required to simulate the interaction of liquids and gases with surfaces defined by boundary conditions. One type of computational flow simulation is the so called Lattice Boltzmann Method. Part of the process of performing the fluid simulation includes defining the geometry of objects relevant to the simulation. Frequently, the geometry can be defined using computer-aided design (CAD). For example, CAD systems can be used to define the geometry of the physical objects to simulate, such as a car, wind turbine, air duct, etc.

One problem that frequently arises when working with CAD systems is the presence of unintended gaps in the defined geometries. Traditional, approaches to solving this problem are mostly manual and very tedious.

One technique uses octree-based interference detection codes that is a tree data structure where each internal node has exactly eight children. Octrees can be used to partition a three-dimensional space by recursively subdividing it into eight octants. This traditional solution may provide only a rough estimation of where the gap is but fails to provide a meaningful description of the gap. The remainder of the traditional solutions are manual, once a set of faces is identified, the user applies either nearest-point projection or extension of the boundary edges of the faces to produce a set of new surfaces that fill the gaps. The effectiveness of the solution depends on how good the boundary edges describe the contour of the new surface that is created to fill the gap. In some cases, when the CAD edges around the gap region fail to generate a suitable gap surface, the user manually "draws" line(s) on the participating surfaces to generate the set of contours and then joins them to form the gap surface.

SUMMARY

According to an aspect, a computer-implemented method includes selecting by a computing system, a first set of points on a first solid in a computer aided design (CAD) generated drawing, identifying a second set of points on a second solid in the CAD generated drawing, identifying at least one gap between at least one point in the first set of points (first point) and at least one point in the second set of points (second point), and classifying the gap between the first point and the second point as either a significant gap or an insignificant gap.

One or more of the features below are some of the additional features that may be included in the above aspect.

Classifying the gap further includes determining a set of criteria representative of the gap, comparing the determined criteria to threshold values for the criteria, and classifying the gap according to comparison of the determined criteria with the threshold values. The criteria include a length value corresponding to a physical distance between the first point and the second point and an angular value that represents an angle formed by an intersection of two rays normal to the surfaces of each of the first and second solids at the respective first point and second point.

Identifying at least one gap, further includes determining a volume of the identified at least one gap between the first solid and the second solid by applying to the gap a Delaunay three dimensional mesh (Delaunay mesh) comprised of tetrahedrons such that no point of the first set of points that includes the first point and the second set of points that includes the second point are inside of the volume of a given one of the tetrahedrons. The method further comprising excluding at least one tetrahedron of the tetrahedrons of the Delaunay mesh from the volume based on the length of an edge that touches both the first solid and the second solid. The method of further includes excluding at least one tetrahedron of the tetrahedrons of the Delaunay mesh from the volume based on a vertex angle of an isosceles triangle where the base of the isosceles triangle is an edge of the tetrahedron and one side of the isosceles triangle is normal to the surface of the first solid. The method further includes excluding at least one tetrahedron of the tetrahedrons of the Delaunay mesh from the volume based on a vertex angle of an isosceles triangle where the base of the isosceles triangle is an edge of the tetrahedron and one side of the isosceles triangle is normal to the surface of the first solid.

The method further includes filling at least the gaps classified as significant in the CAD generated drawing with a fill shape to provide a corrected CAD generated drawing. The gap fill process identifies a union of multi-solids that satisfy user defined criterion to fill the gap. The corrected CAD generated drawing is a representation of a physical object, and to the method further includes generating from the corrected CAD generated drawing a model of a simulation space including a lattice structure represented as a collection of voxels, with the voxels having appropriate resolutions to account for surfaces of the physical object, and simulating, by the one or more computer systems a fluid flow in the simulation space.

According to an additional aspect, a system includes one or more processing devices, memory operatively coupled to the one or more processor devices, and one or more storage devices storing instructions that are operable, when executed by the one or more processing devices, to configure the system to identify a first set of points on a first solid in a computer aided design (CAD) generated drawing of a physical object, identify a second set of points on the second solid in the CAD design, determine a volume of the gap between the first solid and the second solid by applying a Delaunay mesh of tetrahedrons of the first set of points and the second set of points to the gap.

One or more of the features below are some of the additional features that may be included in the above aspect.

The system is configured to determine the volume of the gap and is further configured to identify tetrahedrons of the Delaunay mesh, which have corners that touch each of the first solid and the second solid. The system is further configured to exclude at least one tetrahedron of the tetrahedrons of the Delaunay mesh from the volume based on the length of an edge that touches both the first solid and the second solid. The system is further configured to exclude at least one tetrahedron from the volume based on a vertex angle of an isosceles triangle where the base of the isosceles triangle is an edge of the tetrahedron and one side of the isosceles triangle is normal to the surface of the first solid.

The system is further configured to fill at least the gaps classified as significant in the CAD generated drawing with a fill shape to provide a corrected CAD generated drawing, which is a union of multi-solids that satisfy user defined criterion to fill the gap. The corrected CAD generated drawing is a representation of a physical object, with the system further configured to generate from the corrected CAD generated drawing a model of a simulation space including a lattice structure represented as a collection of voxels, with the voxels having appropriate resolutions to account for surfaces of the physical object and simulate a fluid flow in the simulation space.

According to an additional aspect, a computer program product tangibly stored on a to non-transitory hardware storage device the computer program for identifying gaps in a computer aided design figure, the computer program product comprising instructions that are operable, when executed by a system to cause the system to identify a first set of points on a first solid in a CAD design, identify a second set of points on the second solid in the CAD design, determine a volume of the gap between the first solid and the second solid by applying a Delaunay three dimensional tetrahedral mesh of the first set of points and the second set of points to the gap.

One or more of the features below are some of the additional features that may be included in the above aspect.

The instructions to determine the volume of the gap further comprise instructions to identify tetrahedrons of the Delaunay mesh that have corners that touch each of the first solid and the second solid. The instructions to determine the volume of the gap further comprise instructions to exclude at least one tetrahedron from the volume based on the length of an edge that touches both the first solid and the second solid. The instructions to determine the volume of the gap further comprise instructions to exclude at least one tetrahedron from the volume based on a vertex angle of an isosceles triangle where the base of the isosceles triangle is an edge of the tetrahedron and one side of the isosceles triangle is normal to the surface of the first solid.

One or more of the above aspects may include one or more of the following advantages.

The above aspects may enable computer-aided design (CAD) drawings to better serve as a basis for defining object geometries (features) for fluid flow simulations, computer aided manufacturing, etc., than current approaches. The approach discussed herein provides an approach that can avoid the manual and tedious techniques currently used and thus same time and provide an overall more efficient process than current approaches. The approaches described herein provide more precise estimations of gap locations and provides meaningful descriptions of the gap extent, while avoiding solutions that are manual, and which require a user to manually fill in identified gaps.

In some implementations, corrected CAD drawing(s) can be used to generate a simulation environment in a system that performs fluid flow simulation. The fluid flow simulation involve interactions of those fluids with surfaces defined by boundary conditions of an object represented by the corrected CAD drawing(s), where the geometry (physical features) of the object relevant to the simulation are defined with an absence of unintended gaps of significance in the defined geometry.

The details of one or more embodiments of the subject matter described in this specification are set forth in the accompanying drawings and the description below. Other features, aspects, and advantages of the subject matter will become apparent from the description, the drawings, and the claims.

DETAILED DESCRIPTION

Problems with current approaches to gap detection/correction are that these approaches are mostly or completely manual processes that are fully reliant on the individual CAD surface geometry and their boundary edges which often fail to produce a proper filling of gaps. A gap between two solids is a fundamental property of the two solids that does not depend on how the two solids have been individually piecewise described (regarding faces) for the sake of computer-aided design and/or manufacturing.

Figure 1:
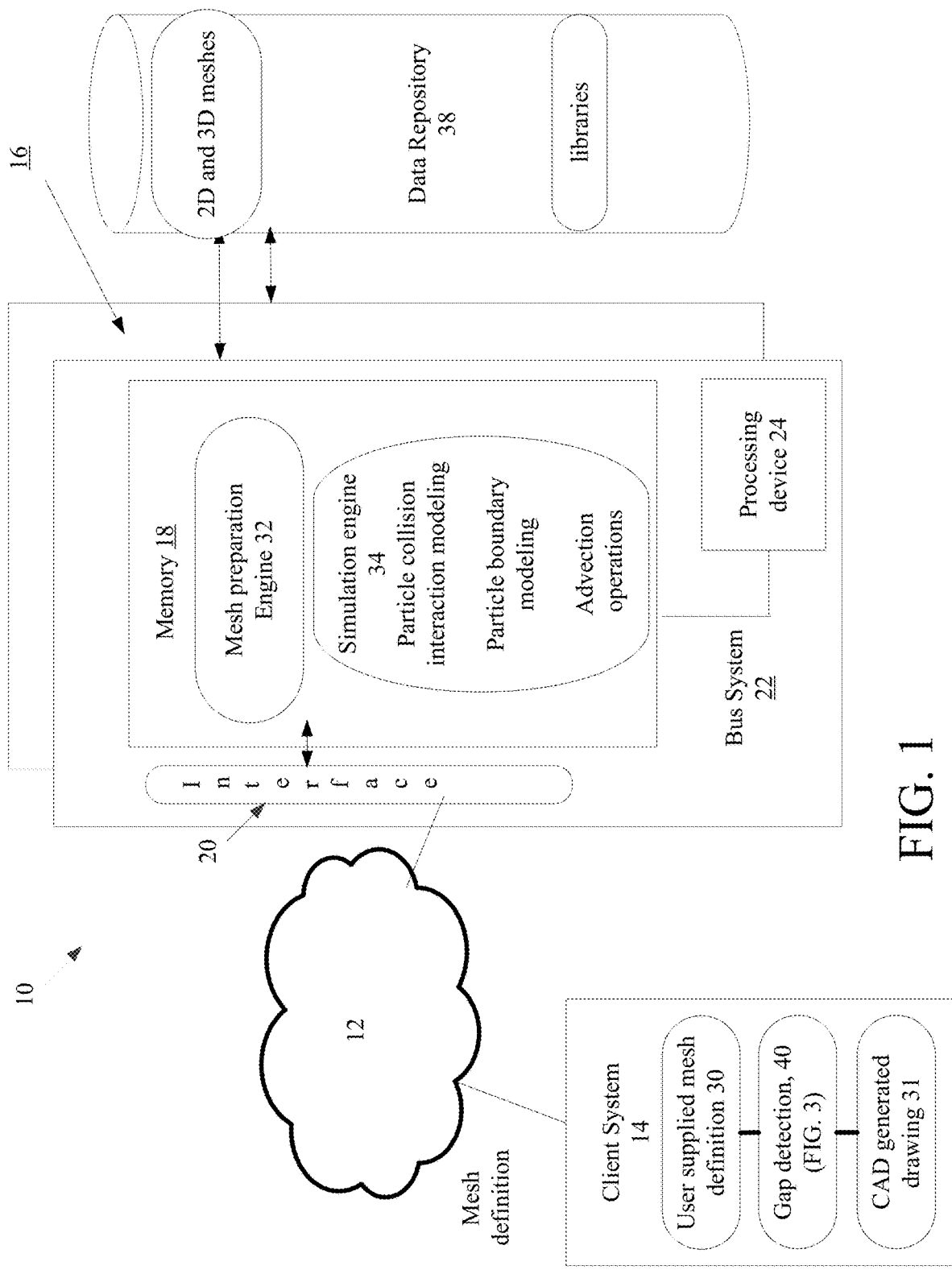
FIG. 1 depicts a system for simulation of fluid flows.

Referring to FIG. 1, a system 10 for simulating a fluid flow, e.g., about a representation of a physical object is shown. The system 10 in this implementation is based on a client-server architecture and includes a server system 12 implemented as a massively parallel computing system 12 and a client system 14. The server system 12 includes memory 18, a bus system 22, interfaces 20 (e.g., user interfaces/network interfaces/display or monitor interfaces, etc.) and a processing device 24. In memory 18, are a mesh preparation engine 32 and a simulation engine 34.

While FIG. 1 shows the mesh preparation engine 32 in memory 18, the mesh preparation engine can be a third party application that is executed on a different system than server 12. Whether the mesh preparation engine 32 executes in memory 18 or is executed on a different system than server 12, the mesh preparation engine 32 receives a user-supplied mesh definition 30 and the mesh preparation engine 32 prepares a mesh and sends the prepared mesh to the simulation engine 34. The simulation engine 34 includes a particle collision interaction module, a particle boundary model module and advection module that performs advection operations. The system 10 accesses a data repository 38 that stores 2D and/or 3D meshes and libraries.

Prior to execution of a simulation in the simulation engine, a simulation space is modeled as a collection of voxels. Typically, the simulation space is generated using a computer-aided-design (CAD) program. For example, a CAD program could be used to draw an micro-device positioned in a wind tunnel. Thereafter, data produced by the CAD program is processed to add a lattice structure having appropriate resolution and to account for objects and surfaces within the simulation space. As discussed above one of the challenges in use of CAD drawings to generate the simulation space includes problems dealing with both identification of and proper filling of gaps in CAD generated geometries.

Discussed below will be a computer aided design (CAD) correction process 40 for construction of CAD drawing(s) of suitable quality having few or no gaps of significance for use with mesh construction engines. In essence, the CAD correction process 40 (discussed in FIG. 3) enhances CAD drawing(s) 31 for the mesh construction engine 32.

Figure 2:
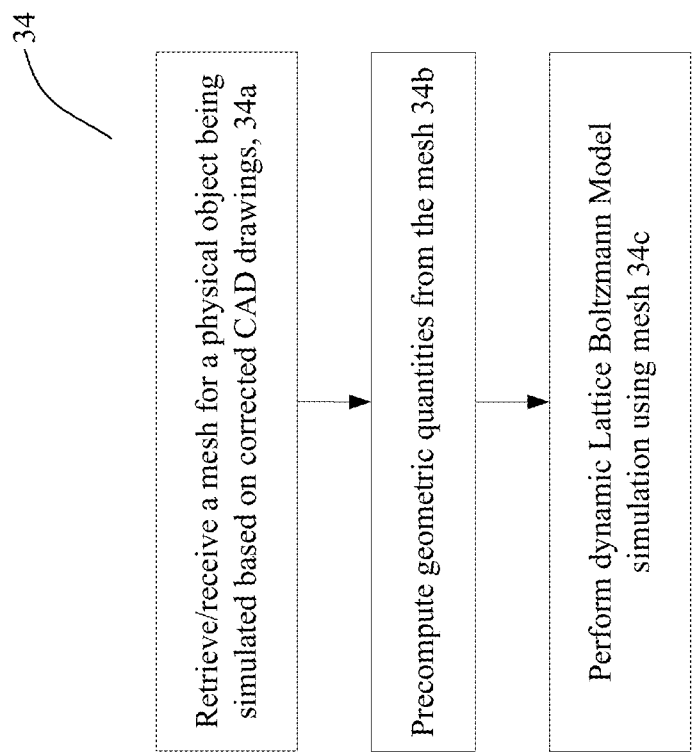
FIG. 2 depicts a flow chart showing operations for formulation of a Lattice Boltzmann Model simulation.
Figures 3, 4A:
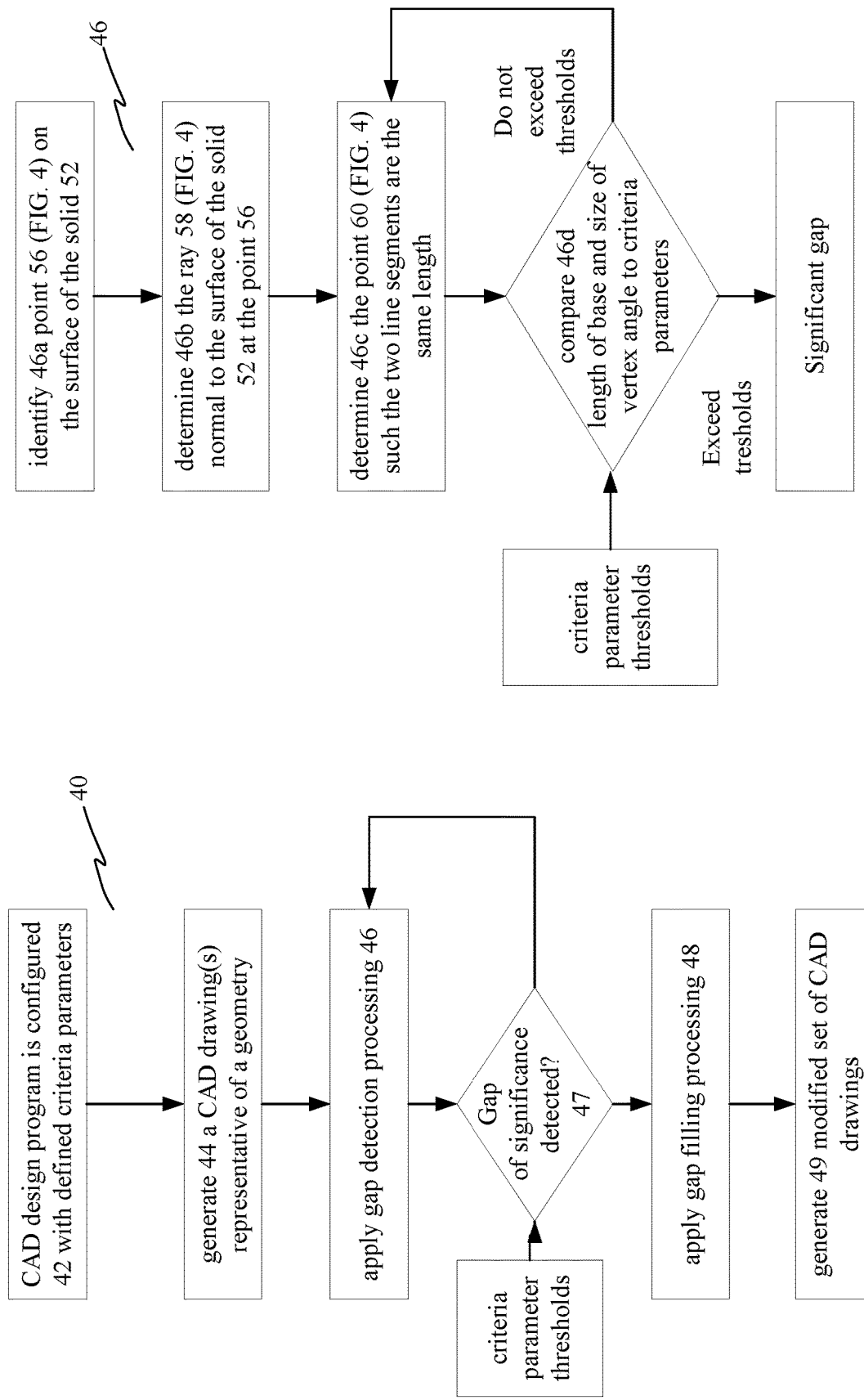
FIGS. 3, 4A, 8 are flow diagrams that illustrate aspects of gap processing for gaps between two CAD generated solids.

Referring now to FIG. 2, a process for simulating fluid flow about a representation of a physical object is shown. In the example that will be discussed herein, the physical object is an airfoil. The use of an airfoil is merely illustrative however, as the physical object can be of any shape, and in particular can have planar and/or curved surface(s). The process receives 34$a$, e.g., from client system 14 or by retrieval from the data repository 38, a mesh for the physical object being simulated. The mesh is based on CAD drawing(s) of suitable quality having few or no gaps of significance for use with mesh construction engines provided by the CAD correction process 40 (FIG. 3). In other embodiments, either an external system or the server 12 based on user input, generates the mesh for the physical object being simulated. The process precomputes 34$b$ geometric quantities from the retrieved mesh and performs 34$c$ dynamic Lattice Boltzmann Model simulation using the precomputed geometric quantities corresponding to the retrieved mesh. Lattice Boltzmann Model simulation includes the simulation of evolution of particle distribution and advection of particles to a next cell $\bar{q}$ in the LBM mesh.

Referring now to FIG. 3, a CAD design gap correction process 40 (CAD design process 40) is shown. In the CAD design process 40, a CAD design program is configured 42 with certain defined gap criteria parameters. One set of the defined parameters is a threshold value $\alpha^{th}$ for a vertex angle size and the other parameter is a threshold value for gap length $d^{th}$. The CAD design process generates 44 a CAD drawing(s) representative of a geometry, e.g., a relatively complex geometry from a defined description of a solid object to be simulated. Upon generation of the CAD drawing(s), (or during generation of the CAD drawing(s) gap detection processing 46 is applied. For all gaps of significance 47 that are detected, gap filling processing 48 is applied to generate 49 a modified set of CAD drawing(s) having detected gaps (of significance) filled according to user-defined criteria.

The user defined criteria are based on aspects of the expected use of the CAD drawings. For example, tighter criteria can be applied in flow simulations of high Mach number over an airfoil in comparison to low Mach number simulations over a mirror of a car. The user defined criteria involve setting values for the threshold values $d^{th}$ and $\alpha^{th}$. While the CAD design process 40 is applied below to gap correction for an LBM simulation, that is but one example of how that CAD design process 40 could be used. For example, the CAD design process 40 could be used for gap correction in other computation flow dynamic problems, as well in other applications where CAD drawings are used in providing design or simulation environments, etc.

Figure 4:
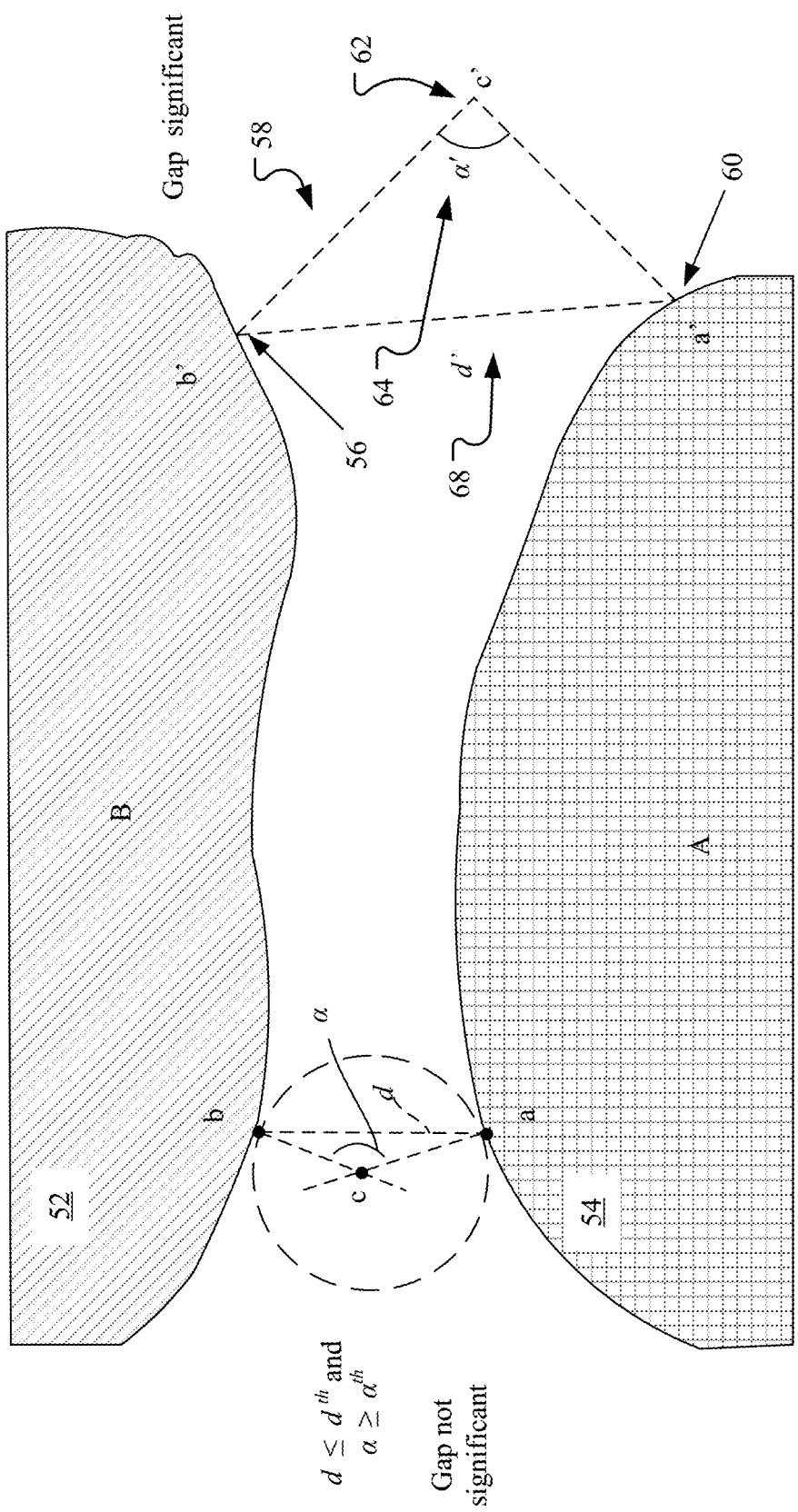
FIGS. 4-7 are illustrations of objects having gaps, which illustrations are useful in understanding aspects of gap processing, including illustrations of tessellated surfaces of CAD solids and gap volume approximation.

Referring now to FIG. 4, a portion of a solid object 52 and a portion of a solid object 54 are shown with a gap that is of significance and a gap that is not of significance. Given a point 56 (b') on a surface of a first one of the solids, in this example on solid 52, a ray 58 (a line having a single endpoint and which line extends infinitely in one direction) is provided that is normal to the surface of the solid 52 at the point 56. For a point 62 (c') on the ray 58, a point 60 (a') on a surface of the solid 54, defines a line segment (not referenced) of the ray 58 that extends from point 56 to point 62 and that is the same length as a line segment (not referenced) from point 60 to point 62. Points 56, 60 and 62 form an isosceles triangle (two sides of equal length) with a vertex angle alpha 64 ($\alpha'$). The length of the base (d') of the triangle 68 and the size of the vertex angle 64 are parameters of the gap that are compared to the configured criteria parameters. d Also shown in FIG. 4 is an example of a gap (line segment ab of a length (d) at an angle alpha ($\alpha$) detected between points a and b of surfaces 52 and 54 and point c on the ray be is not of significance in comparison with values for threshold criteria $d^{th}$ and $\alpha^{th}$ for the length d and angle $\alpha$.

Referring now to FIG. 4A, gap detection processing 46 is shown applied to the portion of the solid object 52 and the portion of a solid object 54 of FIG. 4. In the CAD design process 40, the gap detection processing 46 causes the system to identify 46$a$ the point 56 on the surface of the solid 52 and determine 46$b$ the ray 58 normal to the surface of the solid 52 at the point 56. The system determines 46$c$ for the point 62 on the ray 58, the point 60 on the surface of the solid 54, such the two line segments from point 56 to point 62 and from point 60 to point 62 are the same length.

The system compares 46$d$ the length of the base of the triangle 68 and the size of the vertex angle 64 to the criteria parameter values. If the length of the base 68 is less than or equal to the threshold length and the size of the vertex angle 64 is greater than or equal to the threshold angle, then points 56 and 60 are determined to be of significance and a part of a gap to be filled.

Figure 5:
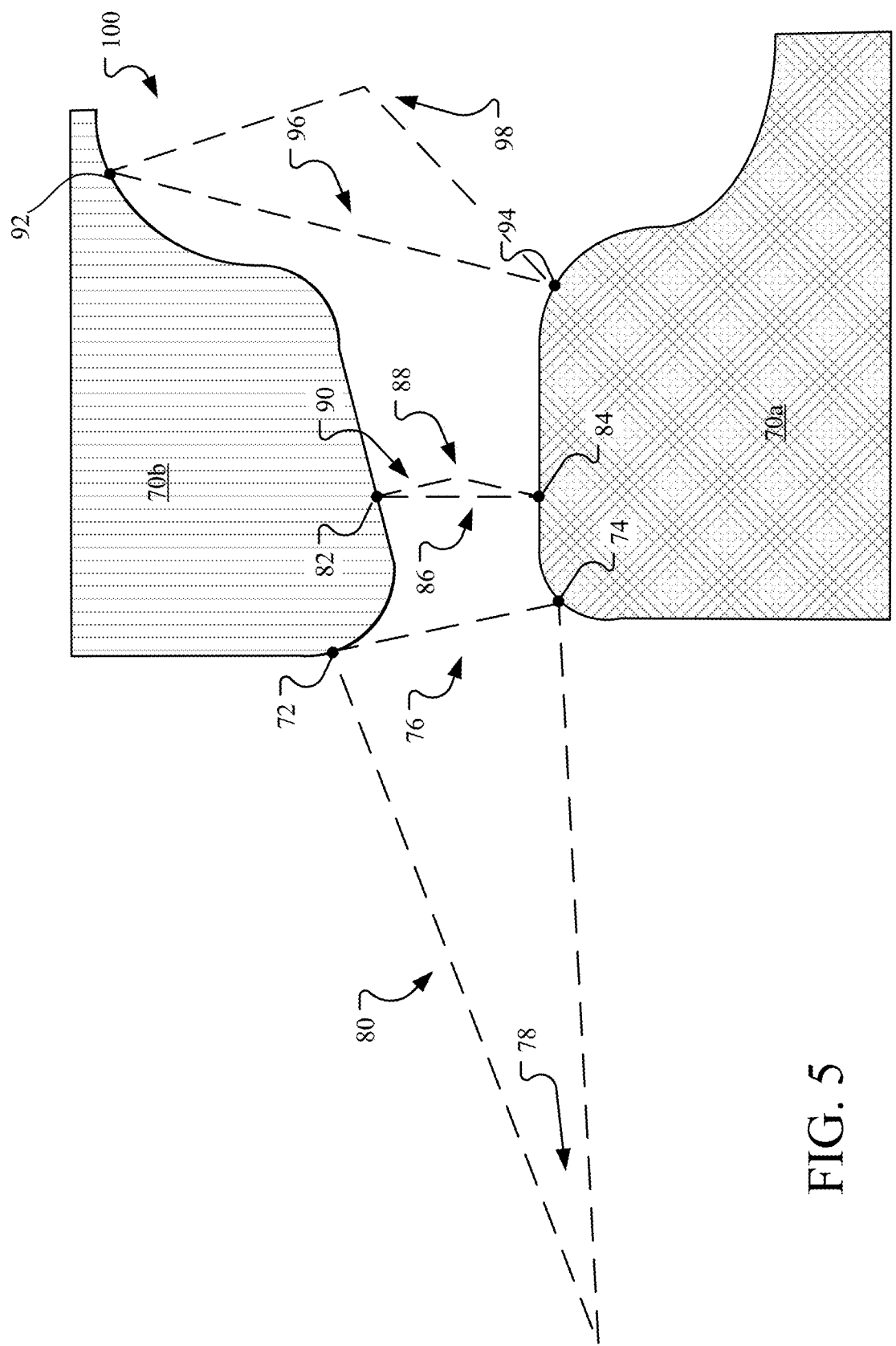

Referring now to FIG. 5, an illustration of two solid objects illustrates how different points may be included or excluded by the gap identification algorithm. In this example, the system identifies the gap between the two solids, solid 100 and solid 70$a$. The system identifies point 72 on the solid 70$b$. The system identifies point 74 as the closest point to point 72 on the solid 70$a$. The length of line 76 (distance) between the points is compared to the threshold distance $d^{th}$. The vertex angle 78 of the isosceles triangle with the line 76 as the base and the side 80 being made up of a line segment normal to the surface of the solid 70$b$ at the point 72 is compared to the threshold angle, $\alpha^{th}$. In this example, the distance between point 72 and point 74 is less than the threshold distance, but the vertex angle 78 is less than the threshold angle, so point 72 is excluded from the gap.

As another example, the system identifies point 82 on the solid 70$b$. The system identifies point 84 as the closest point to point 82 on the solid 70$a$. The length of line 86 (distance)

between the points is compared to the threshold distance $d^{th}$. The vertex angle 88 of the isosceles triangle with the line 86 as the base and the side 90 being made up of a line segment normal to the surface of the solid 70b at the point 82 is compared to the threshold angle, $\alpha^{th}$. In this example, the distance between point 82 and point 84 is less than the threshold distance and the vertex angle 88 is greater than the threshold angle, so point 82 is included in the gap.

As a final example, the system identifies point 92 on the solid 70b. The system identifies point 94 as the closest point to point 92 on the solid 70a. The length of line 96 (distance) between the points is compared to the threshold distance $d^{th}$. The vertex angle 98 of the isosceles triangle with the line 96 as the base and the side 100 being made up of a line segment normal to the surface of the solid 70b at the point 92 is compared to the threshold angle, $\alpha^{th}$. In this example, the distance between point 92 and point 94 is greater than the threshold distance and the vertex angle 98 is less than the threshold angle because both criteria are not met, the point 92 is excluded from the gap.

As a practical matter, it's is clearly a difficult task to find all the point pairs (a,b) from a set of CAD solids because there are an infinite set of such point pairs that can satisfy the user-defined criteria. However, a similar outcome can be obtained by applying an approximation.

Figure 6:
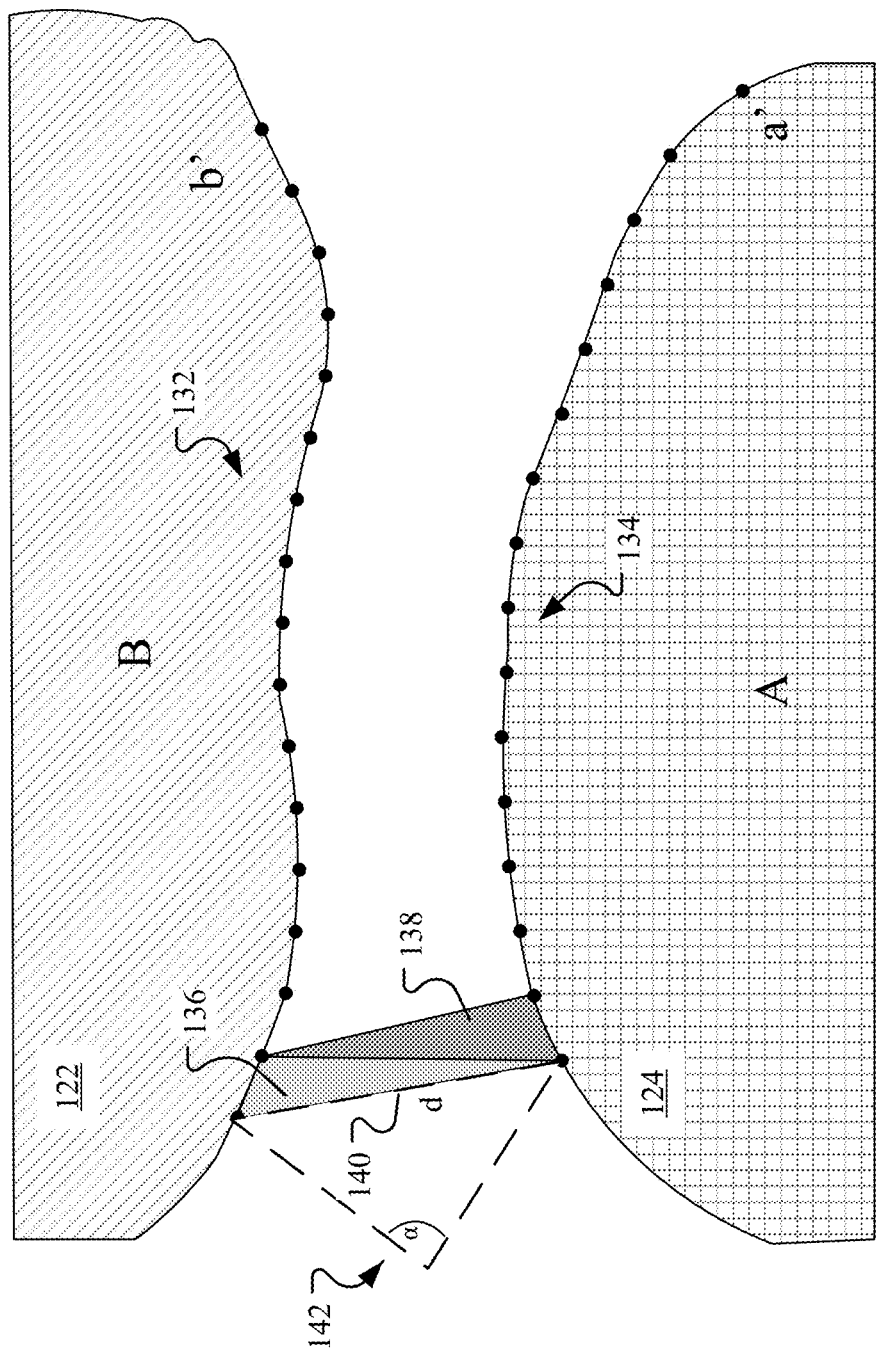

Referring now to FIG. 6 a pair "tessellated" surfaces of a CAD generated solid objects 122 and solid 124. By tessellated is meant a covering of the gap (a portion or the whole), without gaps or overlaps by congruent plane figures of one type or a few types. Once the approximate location of the gap is identified, as described, above, the surface of solid 122 and the surface of solid 124 that are near the gap are tessellated to generate a set 132a of points sampling the surface region of solid 122 and a set 134 of points sampling the surface region of the solid 124. It should be noted that the CAD solids are represented as three-dimensional objects. The figures herein are represented in two dimensions for explanatory purposes.

The sets 132 and 134 of points can be provided together as input to form a Delaunay tetrahedralization of the three-dimensional volume containing the point set. In two dimensional space, a Delaunay Triangulation for a given set P of discrete points in a plane is a triangulation DT(P) such that no point in P is inside the circumcircle of any triangle in DT(P). Delaunay triangulations maximize the minimum angle of all the angles of the triangles in the triangulation; they tend to avoid sliver triangles. In three dimensional space (3D), the Delaunay tetrahedralization of a set of points generates tetrahedrons where the circumscribed-sphere of each tetrahedron spanning four points is empty of all other points in the set.

The system identifies tetrahedrons that that touch both A and B, referred to herein as "multi-solids" (for example, the multi-solid 136 and the multi-solid 138). From the set of all identified multi-solids, the system selects multi-solids that satisfy the user-provided tolerance ($d^{th}$, $\alpha^{th}$) where distance threshold parameter ($d^{th}$) is used to eliminate cells that have a base 140 that is longer than $d^{th}$ and the angle parameter ($\alpha^{th}$) is used to eliminate cells where the circumcenter of the cell makes a solid angle 142 smaller than $\alpha^{th}$, as described above.

Figure 7:
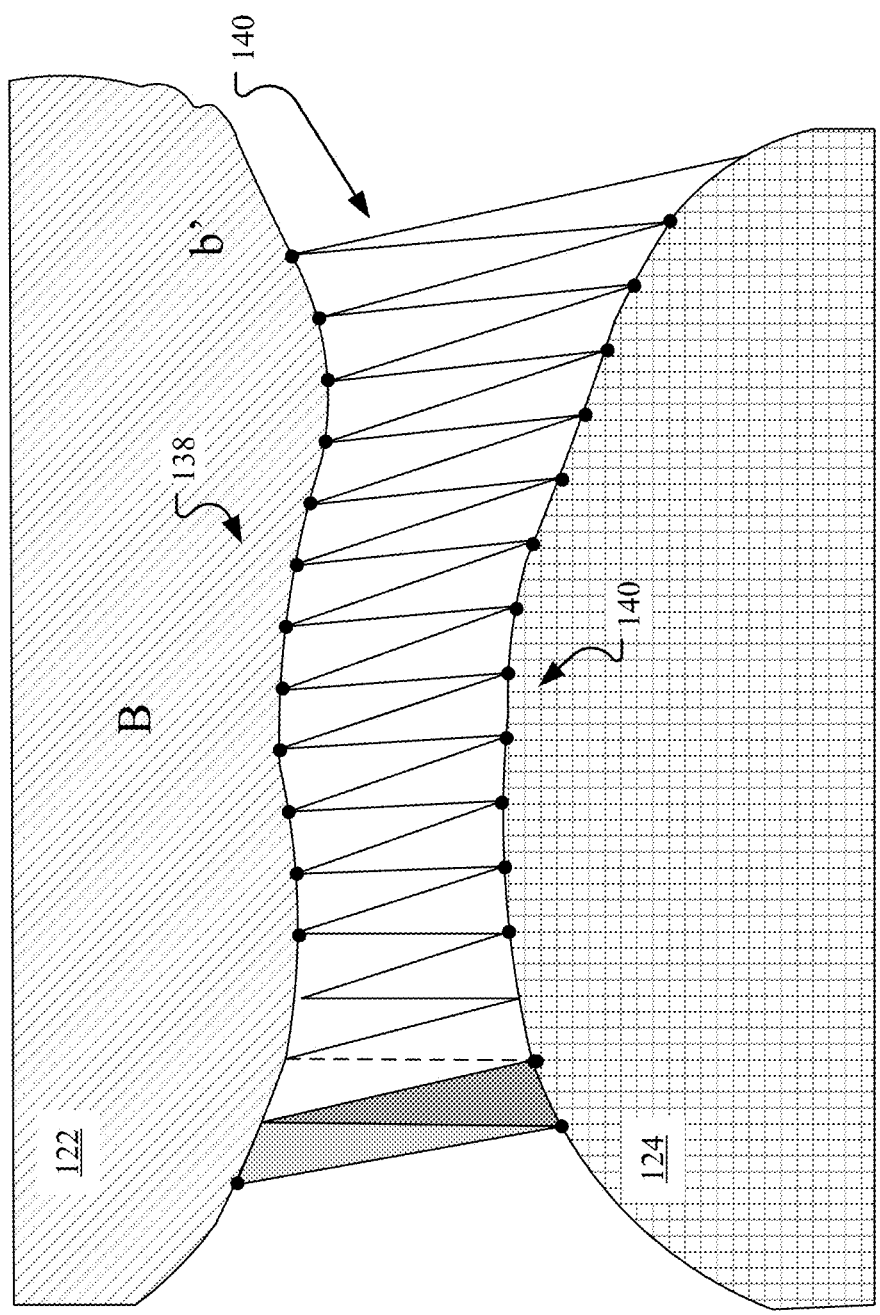

Referring to now also to FIG. 7, a union of the multi-solids 136 and 138 (collectively 140) that satisfy this criterion gives the approximation volume of the gap between the two solids. Once the gap is defined, the gap can be filled by a shape that is made up of the union of the multi-solids 136, 138. The system can fill the gap between the solids using the union of the multi-solids.

Figure 8:
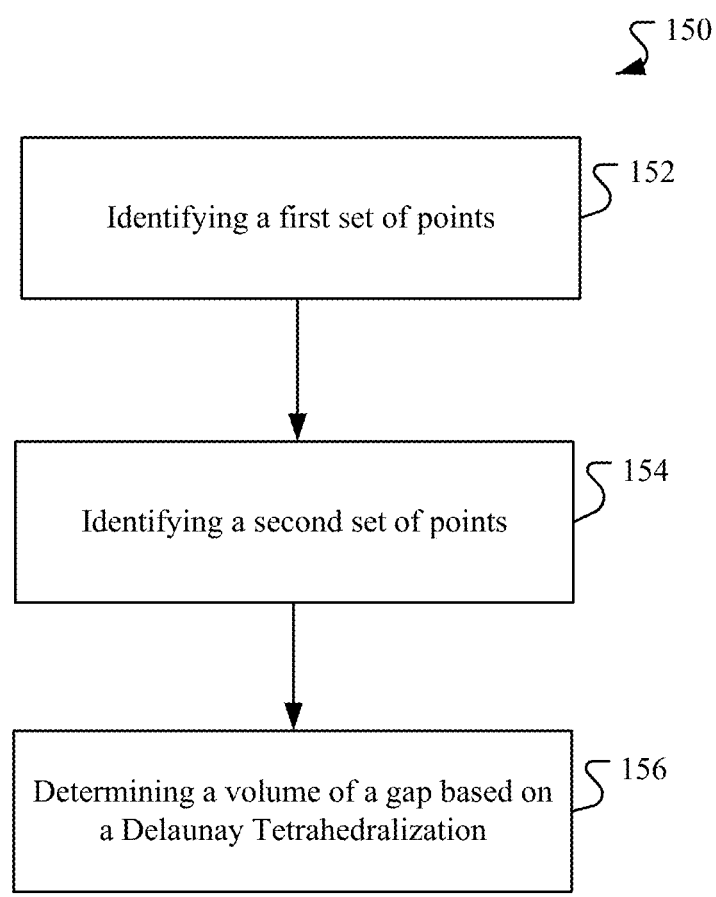

Referring now to FIG. 8, an example process 150 for definite gaps in CAD geometries. The process 150 identifies 152 a first set of points on a first solid in a CAD design. The first set of points may be identified, for example, using a tessellation algorithm. The process 150 identifies 154 a second set of points on the second solid in the CAD design. The second set of points may be identified, for example, using a tessellation algorithm. The process determines 156 a volume of the gap between the first solid and the second solid based on a Delaunay mesh comprised of tetrahedrons (tetrahedral shapes) such that no point of the first set of points and the second set of points are within the volume of a given one of the tetrahedral shapes (not shown).

In some implementations, the process 150 may determine a volume that defines the gap between the first solid and the second solid, for example, by identifying tetrahedrons that have corners that touch each of the first solid and the second solid. In some implementations, the process 150 may exclude tetrahedrons from the volume based on the length of an edge that touches both the first solid and the second solid. The process 150 may exclude tetrahedrons from the volume based on a vertex angle of an isosceles triangle where the base of the isosceles triangle is an edge of the tetrahedron and one side of the isosceles triangle is normal to the surface of the first solid. Once the gaps in the CAD drawing are filled, the CAD drawing can be used to define the simulation volume used for a fluid simulation.

Having filled gaps of significance in the CAD drawing(s), the CAD drawing(s) are used to define the simulation volume or mesh that is used for a fluid flow simulation performed by the simulation engine 34. For example, as described in U.S. patent application Ser. No. 11/463,673, entitled COMPUTER SIMULATION OF PHYSICAL PROCESS (now issued as U.S. Pat. No. 7,558,714) incorporated herein in its entirety by reference.

Figure 13A:
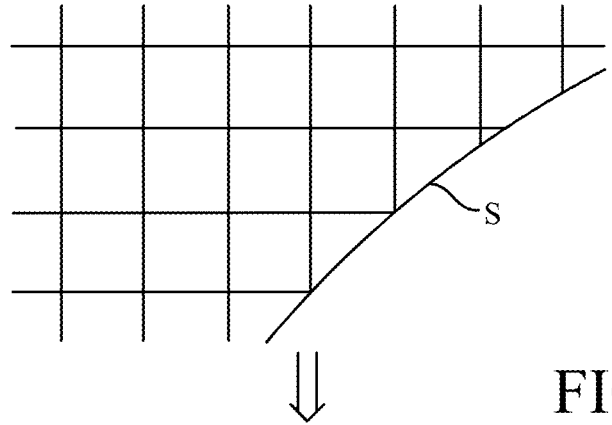
FIGS. 13A-13B are illustrations of lattice structures used by the system of FIG. 1 (prior art).
Figure 13B:
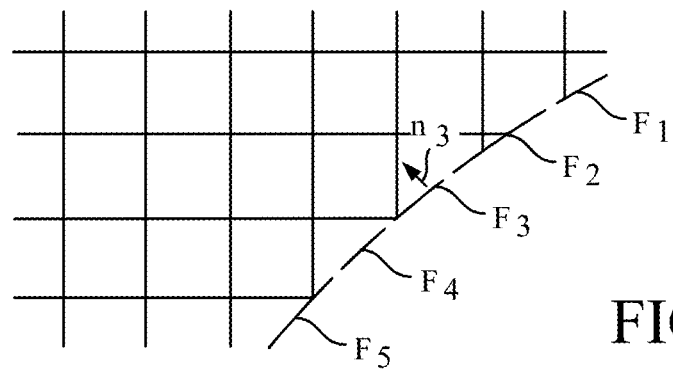
Figure 14:
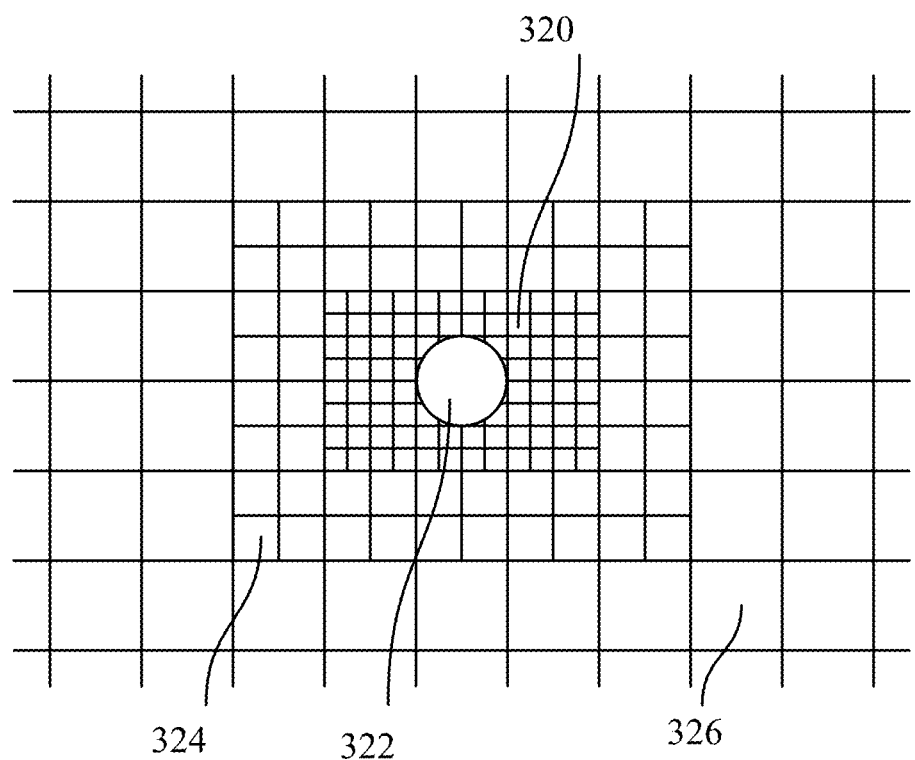
FIGS. 14 and 15 illustrate variable resolution techniques (prior art).
Figure 15:
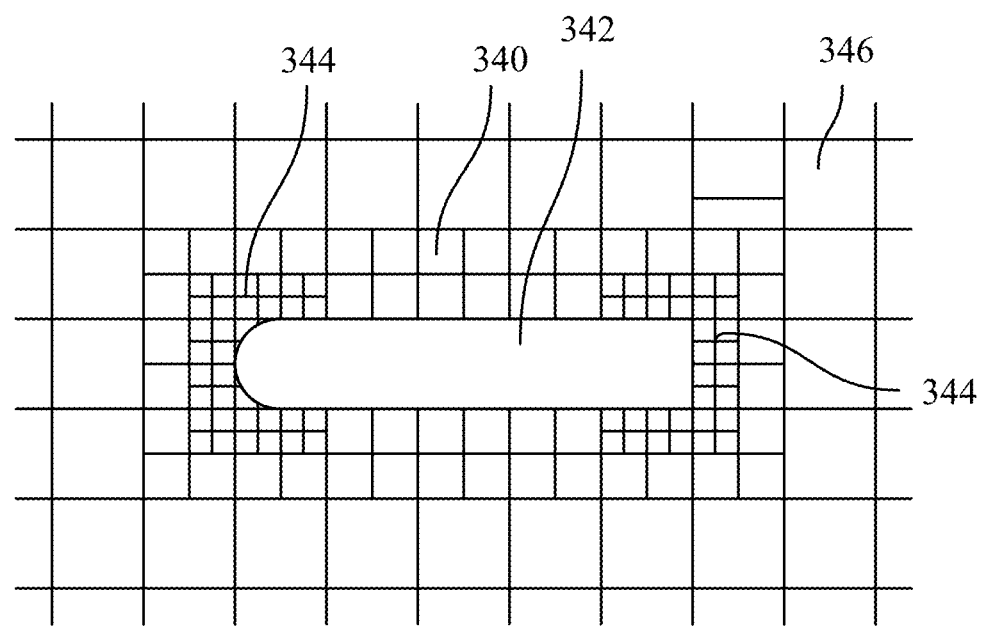
Figure 16:
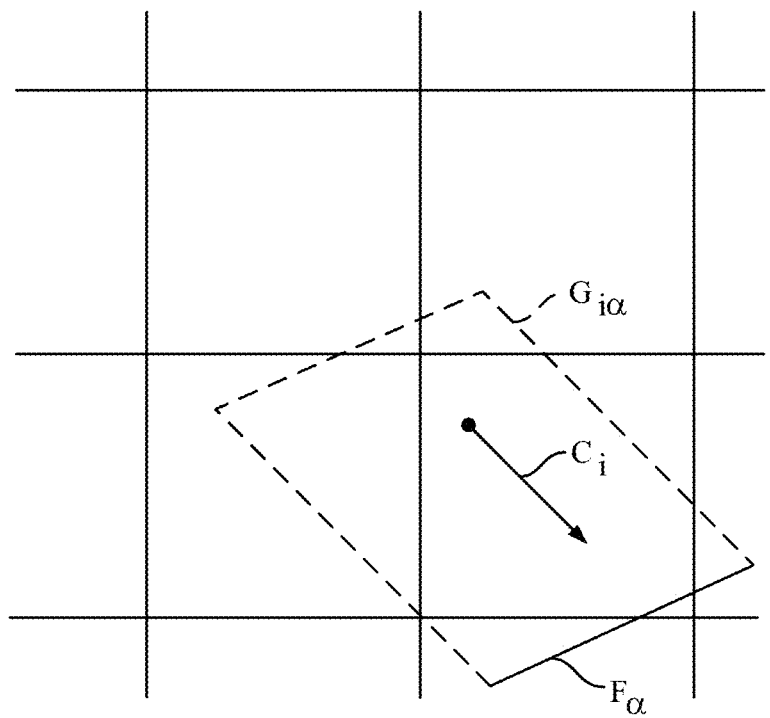
FIG. 16 illustrates movement of particles (prior art).
Figure 17:
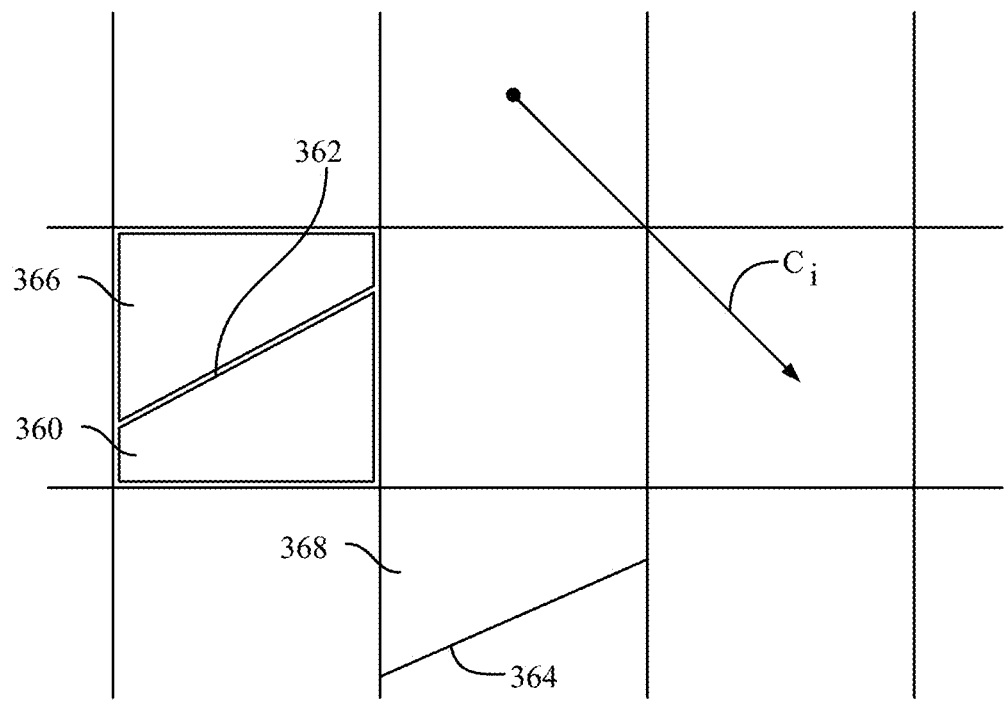
FIG. 17 illustrates regions affected by a facet of a surface (prior art).

In the procedure discussed in FIG. 11 below, a flow simulation process is described using gap corrected CAD drawings to configure a simulation space. In the figures that follow such as FIG. 12 the perspective view of a microblock, FIGS. 13A-13B illustrations of lattice structures, FIGS. 14 and 15 illustrations of variable resolution techniques, FIG. 16 illustrations of movement of particles, and FIG. 17 illustration of regions affected by a facet of a surface, each of these FIGS. 12-17 are labeled as prior art because these figures appear in the above referenced patent.

However, the figures as they appear in the above Patent do not take into consideration any modifications that would be made to a flow simulation using gap corrected CAD drawings to configure a simulation space, because the gap correction process described herein is not described in the above referenced Patent.

Model Simulation Space

In a LBM-based physical process simulation system, fluid flow is represented by the distribution function values $f_i$, evaluated at a set of discrete velocities $c_i$. The dynamics of the distribution function is governed by Equation I1 where $f_i(0)$ is known as the equilibrium distribution function, defined as:

$$f_\alpha^{(0)} = w_\alpha \rho \left[ 1 + u_\alpha + \frac{u_\alpha^2 - u^2}{2} + \frac{u_\alpha(u_\alpha^2 - 3u^2)}{6} \right] \quad \text{Eq. (I1)}$$

where $u_\alpha = c_i \cdot \frac{u}{T}$

This equation is the well-known lattice Boltzmann equation that describes the time-evolution of the distribution function, $f_i$. The left-hand side represents the change of the distribution due to the so-called "streaming process." The streaming process is when a pocket of fluid starts out at a mesh location, and then moves along one of plural velocity vectors to the next mesh location. At that point, the "collision factor," i.e., the effect of nearby pockets of fluid on the starting pocket of fluid, is calculated. The fluid can only move to another mesh location, so the proper choice of the velocity vectors is necessary so that all the components of all velocities are multiples of a common speed.

The right-hand side of the first equation is the aforementioned "collision operator" which represents the change of the distribution function due to the collisions among the pockets of fluids. The particular form of the collision operator is of the Bhatnagar, Gross and Krook (BGK) operator. The collision operator forces the distribution function to go to the prescribed values given by the second equation, which is the "equilibrium" form.

The BGK operator is constructed according to the physical argument that, no matter what the details of the collisions, the distribution function approaches a well-defined local equilibrium given by $\{f^{eq}(x,v,t)\}$ via collisions:

$$C = -\frac{1}{\tau}(f - f^{eq}), \quad \text{Eq. (I2)}$$

where the parameter $\tau$ represents a characteristic relaxation time to equilibrium via collisions. Dealing with particles (e.g., atoms or molecules) the relaxation time is typically taken as a constant.

From this simulation, conventional fluid variables, such as mass $\rho$ and fluid velocity $u$, are obtained as simple summations in Equation (I3).

$$\rho(x, t) = \sum_i f_i(x, t); \, \rho u(x, t) = \sum_i c_i f_i(x, t); \quad \text{Eq. (I3)}$$

$$DT(x, t) = \sum_i (c_i - u)^2 f_i(x, t)$$

where $\rho$, $u$, and $T$ are, respectively, the fluid density, velocity and temperature, and $D$ is the dimension of the discretized velocity space (not necessarily equal to the physical space dimension).

Due to symmetry considerations, the set of velocity values are selected in such a way that they form certain lattice structures when spanned in the configuration space. The dynamics of such discrete systems obeys the LBE having the form $$f f_i(x+c_i,t+1) - f_i(x,t) = C_i(x,t)$$

where the collision operator usually takes the BGK form as described above. By proper choice of the equilibrium distribution forms, it can be theoretically shown that the lattice Boltzmann equation gives rise to correct hydrodynamics and thermo-hydrodynamics. That is, the hydrodynamic moments derived from $f_i(x,t)$ obey the Navier-Stokes equations in the macroscopic limit. These moments are defined by Equation (I3) above.

The collective values of $c_i$ and $w_i$ define a LBM model. The LBM model can be implemented efficiently on scalable computer platforms and run with great robustness for time unsteady flows and complex boundary conditions.

A standard technique of obtaining the macroscopic equation of motion for a fluid system from the Boltzmann equation is the Chapman-Enskog method in which successive approximations of the full Boltzmann equation are taken. In a fluid system, a small disturbance of the density travels at the speed of sound. In a gas system, the speed of sound is generally determined by the temperature. The importance of the effect of compressibility in a flow is measured by the ratio of the characteristic velocity and the sound speed, which is known as the Mach number.

A general discussion of a LBM-based simulation system is provided below that may be used in conjunction with the above gap filled CAD process to conduct fluid flow simulations. For a further explanation of LBM-based physical process simulation systems the reader is referred to the above incorporated by reference US Patent.

Figure 9:
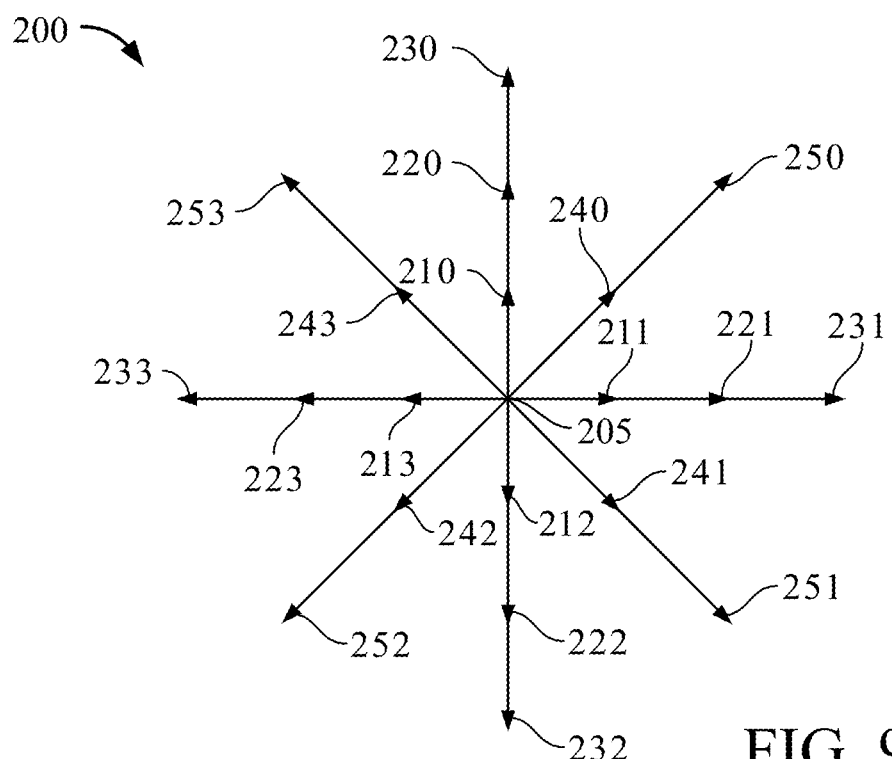
FIGS. 9 and 10 illustrate velocity components of two LBM models represented in Euclidian space (prior art).

Referring to FIG. 9, a first model (2D-1) 200 is a two-dimensional model that includes 21 velocities. Of these 21 velocities, one (205) represents particles that are not moving; three sets of four velocities represent particles that are moving at either a normalized speed (r) (210-213), twice the normalized speed (2r) (220-223), or three times the normalized speed (3r) (230-233) in either the positive or negative direction along either the x or y axis of the lattice; and two sets of four velocities represent particles that are moving at the normalized speed (r) (240-243) or twice the normalized speed (2r) (250-253) relative to both of the x and y lattice axes.

Figure 10:
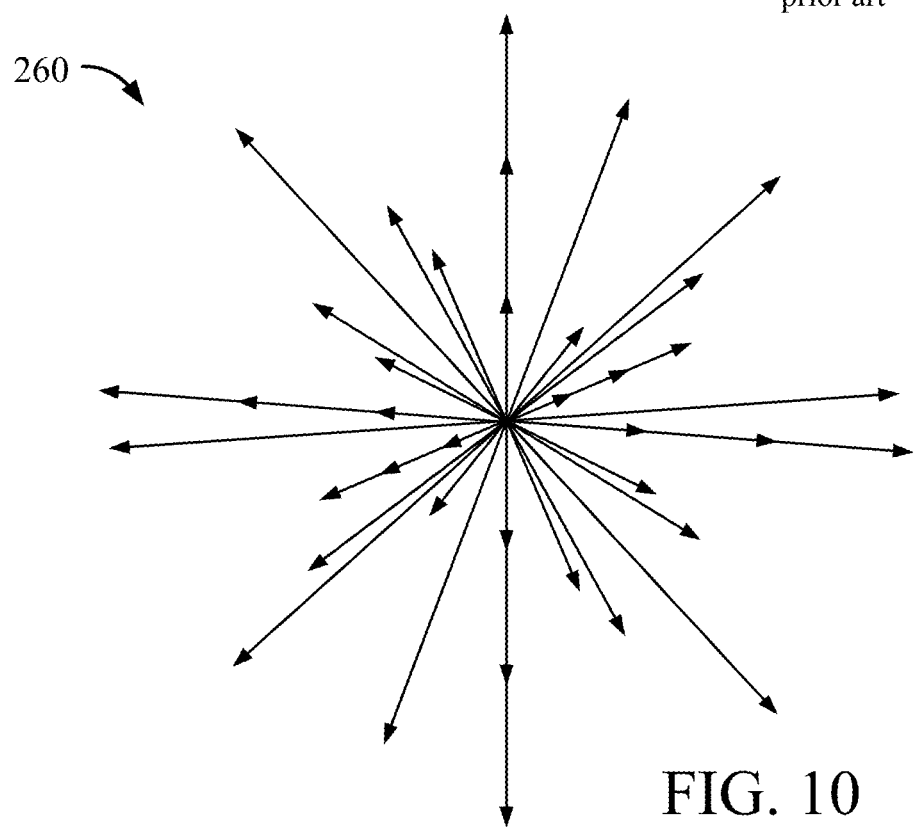

Referring to FIG. 10, illustrated is a second model (3D-1) 260—a three-dimensional model that includes 39 velocities where each velocity is represented by one of the arrowheads of FIG. 10. Of these 39 velocities, one represents particles that are not moving; three sets of six velocities represent particles that are moving at either a normalized speed (r), twice the normalized speed (2r), or three times the normalized speed (3r) in either the positive or negative direction along the x, y or z axis of the lattice; eight represent particles that are moving at the normalized speed (r) relative to all three of the x, y, z lattice axes; and twelve represent particles that are moving at twice the normalized speed (2r) relative to two of the x, y, z lattice axes.

More complex models, such as a 3D-2 model includes 101 velocities and a 2D-2 model includes 37 velocities also may be used. For the three-dimensional model 3D-2, of the 101 velocities, one represents particles that are not moving (Group 1); three sets of six velocities represent particles that are moving at either a normalized speed (r), twice the normalized speed (2r), or three times the normalized speed (3r) in either the positive or negative direction along the x, y or z axis of the lattice (Groups 2, 4, and 7); three sets of eight represent particles that are moving at the normalized speed (r), twice the normalized speed (2r), or three times the normalized speed (3r) relative to all three of the x, y, z lattice axes (Groups 3, 8, and 10); twelve represent particles that are moving at twice the normalized speed (2r) relative to two of the x, y, z lattice axes (Group 6); twenty four represent particles that are moving at the normalized speed (r) and twice the normalized speed (2r) relative to two of the x, y, z lattice axes, and not moving relative to the remaining axis (Group 5); and twenty four represent particles that are moving at the normalized speed (r) relative to two of the x, y, z lattice axes and three times the normalized speed (3r) relative to the remaining axis (Group 9).

For the two-dimensional model 2D-2, of the 37 velocities, one represents particles that are not moving (Group 1); three sets of four velocities represent particles that are moving at either a normalized speed (r), twice the normalized speed (2r), or three times the normalized speed (3r) in either the positive or negative direction along either the x or y axis of the lattice (Groups 2, 4, and 7); two sets of four velocities represent particles that are moving at the normalized speed (r) or twice the normalized speed (2r) relative to both of the x and y lattice axes; eight velocities represent particles that are moving at the normalized speed (r) relative to one of the x and y lattice axes and twice the normalized speed (2r) relative to the other axis; and eight velocities represent particles that are moving at the normalized speed (r) relative to one of the x and y lattice axes and three times the normalized speed (3r) relative to the other axis.

The LBM models described above provide a specific class of efficient and robust discrete velocity kinetic models for numerical simulations of flows in both two- and three-dimensions. A model of this kind includes a particular set of discrete velocities and weights associated with those velocities. The velocities coincide with grid points of Cartesian coordinates in velocity space which facilitates accurate and efficient implementation of discrete velocity models, particularly the kind known as the lattice Boltzmann models. Using such models, flows can be simulated with high fidelity.

Figure 11:
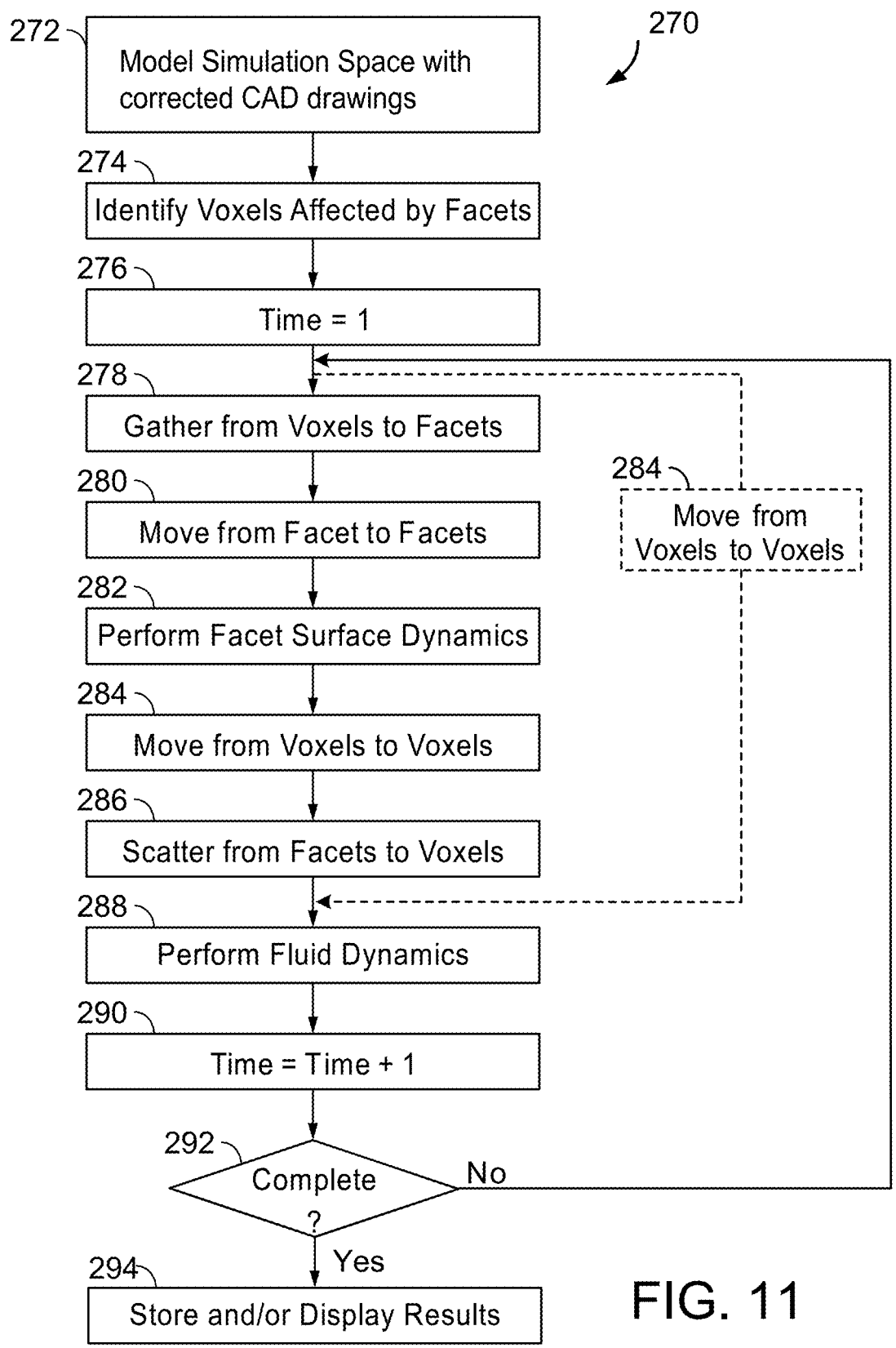
FIG. 11 is a flow chart of a procedure followed by a physical process simulation system using corrected CAD drawings.

Referring to FIG. 11, a physical process simulation system operates according to a procedure 270 to simulate a physical process such as fluid flow is described. Prior to the flow simulation, a simulation space is modeled (step 272) using the corrected CAD drawings discussed above, as a collection of voxels. The simulation space is generated using a computer-aided-design (CAD) program and the gap correction processing of the CAD generated drawings. For example, a CAD program could be used to draw an micro-device positioned in a wind tunnel and the gap correction process can identify gaps of significance and fill in those gaps, without significant user intervention (other than setting threshold values for $d^{th}$ and $\alpha^{th}$. Thereafter, this corrected data produced by the CAD program is processed to add a lattice structure having appropriate resolution and to account for objects and surfaces within the simulation space.

The resolution of the lattice may be selected based on the Reynolds number of the system being simulated. The Reynolds number is related to the viscosity (v) of the flow, the characteristic length (L) of an object in the flow, and the characteristic velocity (u) of the flow:

$$Re=uL/v \qquad \text{Eq. (I4)}$$

The characteristic length of an object represents large scale features of the object. For example, if flow around a micro-device were being simulated, the height of the micro-device might be considered to be the characteristic length.

When flow around small regions of an object (e.g., the side mirror of an automobile) is of interest, the resolution of the simulation may be increased, or areas of increased resolution may be employed around the regions of interest. The dimensions of the voxels decrease as the resolution of the lattice increases.

The state space is represented as $f_i(x,t)$, where $f_i$ represents the number of elements, or particles, per unit volume in state i (i.e., the density of particles in state i) at a lattice site denoted by the three-dimensional vector x at a time t. For a known time increment, the number of particles is referred to simply as $f_i(x)$. The combination of all states of a lattice site is denoted as $f(x)$.

The number of states is determined by the number of possible velocity vectors within each energy level. The velocity vectors consist of integer linear speeds in a space having three dimensions: x, y, and z. The number of states is increased for multiple-species simulations.

Each state i represents a different velocity vector at a specific energy level (i.e., energy level zero, one or two). The velocity $c_i$ of each state is indicated with its "speed" in each of the three dimensions as follows:

$$c_i=(c_{ix},c_{iy},c_{iz}). \qquad \text{Eq.(I5)}$$

The energy level zero state represents stopped particles that are not moving in any dimension, i.e. $c_{stopped}=(0, 0, 0)$. Energy level one states represents particles having a ±1 speed in one of the three dimensions and a zero speed in the other two dimensions. Energy level two states represent particles having either a ±1 speed in all three dimensions, or a ±2 speed in one of the three dimensions and a zero speed in the other two dimensions.

Generating all of the possible permutations of the three energy levels gives a total of 39 possible states (one energy zero state, 6 energy one states, 8 energy three states, 6 energy four states, 12 energy eight states and 6 energy nine states).

Each voxel (i.e., each lattice site) is represented by a state vector f(x). The state vector completely defines the status of the voxel and includes 39 entries. The 39 entries correspond to the one energy zero state, 6 energy one states, 8 energy three states, 6 energy four states, 12 energy eight states and 6 energy nine states. By using this velocity set, the system can produce Maxwell-Boltzmann statistics for an achieved equilibrium state vector.

For processing efficiency, the voxels are grouped in 2×2×2 volumes called microblocks. The microblocks are organized to permit parallel processing of the voxels and to minimize the overhead associated with the data structure. A short-hand notation for the voxels in the microblock is defined as $N_i(n)$, where n represents the relative position of the lattice site within the microblock and n∈{0,1,2, . . . , 7}.

Figure 12:
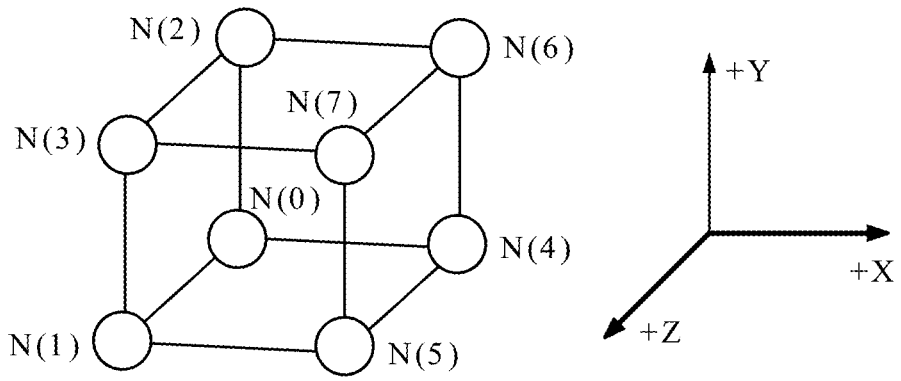
FIG. 12 is a perspective view of a microblock (prior art).

A microblock is illustrated in FIG. 12.

Referring to FIGS. 13A and 13B, a surface S (FIG. 13A) is represented in the simulation space (FIG. 13B) as a collection of facets $F_\alpha$:

$$S=\{F_\alpha\} \qquad \text{Eq.(I6)}$$

where α is an index that enumerates a particular facet. A facet is not restricted to the voxel boundaries, but is typically sized on the order of or slightly smaller than the size of the voxels adjacent to the facet so that the facet affects a relatively small number of voxels. Properties are assigned to the facets for the purpose of implementing surface dynamics. In particular, each facet $F_\alpha$ has a unit normal ($n_\alpha$), a surface area ($A_\alpha$), a center location ($x_\alpha$), and a facet distribution function ($f_i(\alpha)$) that describes the surface dynamic properties of the facet. The total energy distribution function $q_i(\alpha)$ is treated in the same way as the flow distribution for facet and voxel interaction.

Referring to FIG. 14, different levels of resolution may be used in different regions of the simulation space to improve processing efficiency. Typically, the region 320 around an object 322 is of the most interest and is therefore simulated with the highest resolution. Because the effect of viscosity decreases with distance from the object, decreasing levels of resolution (i.e., expanded voxel volumes) are employed to simulate regions 324, 326 that are spaced at increasing distances from the object 322.

Similarly, as illustrated in FIG. 15, a lower level of resolution may be used to simulate a region 340 around less significant features of an object 342 while the highest level of resolution is used to simulate regions 344 around the most significant features (e.g., the leading and trailing surfaces) of the object 342. Outlying regions 346 are simulated using the lowest level of resolution and the largest voxels.

C. Identify Voxels Affected By Facets

Referring again to FIG. 11, once the simulation space has been modeled (step 272), voxels affected by one or more facets are identified (step 274). Voxels may be affected by facets in a number of ways. First, a voxel that is intersected by one or more facets is affected in that the voxel has a reduced volume relative to non-intersected voxels. This occurs because a facet, and material underlying the surface represented by the facet, occupies a portion of the voxel. A fractional factor $P_f(x)$ indicates the portion of the voxel that is unaffected by the facet (i.e., the portion that can be occupied by a fluid or other materials for which flow is being simulated). For non-intersected voxels, $P_f(x)$ equals one.

Voxels that interact with one or more facets by transferring particles to the facet or receiving particles from the facet are also identified as voxels affected by the facets. All voxels that are intersected by a facet will include at least one state that receives particles from the facet and at least one state that transfers particles to the facet. In most cases, additional voxels also will include such states.

Referring to FIG. 16, for each state i having a non-zero velocity vector $c_i$, a facet $F_\alpha$ receives particles from, or transfers particles to, a region defined by a parallelepiped $G_{i\alpha}$ having a height defined by the magnitude of the vector dot product of the velocity vector $c_i$ and the unit normal $n_\alpha$ of the facet ($|c_i n_i|$) and a base defined by the surface area $A_\alpha$ of the facet so that the volume $V_{i\alpha}$ of the parallelepiped $G_{i\alpha}$ equals:

$$V_{i\alpha}=|c_i n_\alpha|A_\alpha \qquad \text{Eq.(I7)}$$

The facet $F_\alpha$ receives particles from the volume $V_{i\alpha}$ when the velocity vector of the state is directed toward the facet ($|c_i n_i|<0$), and transfers particles to the region when the velocity vector of the state is directed away from the facet ($|c_i n_i|>0$). As will be discussed below, this expression must be modified when another facet occupies a portion of the parallelepiped $G_{i\alpha}$, a condition that could occur in the vicinity of non-convex features such as interior corners.

The parallelepiped $G_{i\alpha}$ of a facet $F_\alpha$ may overlap portions or all of multiple voxels. The number of voxels or portions thereof is dependent on the size of the facet relative to the size of the voxels, the energy of the state, and the orientation of the facet relative to the lattice structure. The number of affected voxels increases with the size of the facet. Accordingly, the size of the facet, as noted above, is typically selected to be on the order of or smaller than the size of the voxels located near the facet.

The portion of a voxel $N(x)$ overlapped by a parallelepiped $G_{i\alpha}$ is defined as $V_{i\alpha}(x)$. Using this term, the flux $\Gamma_{i\alpha}(x)$ of state i particles that move between a voxel $N(x)$ and a facet $F_\alpha$ equals the density of state i particles in the voxel ($N_i(x)$) multiplied by the volume of the region of overlap with the voxel ($V_{i\alpha}(x)$):

$$\Gamma_{i\alpha}(x)=N_i(x)+V_{i\alpha}(x). \qquad \text{Eq.(I8)}$$

When the parallelepiped $G_{i\alpha}$ is intersected by one or more facets, the following condition is true:

$$V_{i\alpha}=\Sigma V_{i\alpha}(x)+\Sigma V_{i\alpha}(\beta) \qquad \text{Eq.(I9)}$$

where the first summation accounts for all voxels overlapped by $G_{i\alpha}$ and the second term accounts for all facets that intersect $G_{i\alpha}$. When the parallelepiped $G_{i\alpha}$ is not intersected by another facet, this expression reduces to:

$$V_{i\alpha}=\Sigma V_{i\alpha}(x). \qquad \text{Eq.(I10)}$$

D. Perform Simulation

Once the voxels that are affected by one or more facets are identified (step 274), a timer is initialized to begin the simulation (step 276). During each time increment of the simulation, movement of particles from voxel to voxel is simulated by an advection stage (steps 278-286) that accounts for interactions of the particles with surface facets. Next, a collision stage (step 288) simulates the interaction of particles within each voxel. Thereafter, the timer is incremented (step 290). If the incremented timer does not indicate (step 292) that the simulation is complete, the advection and collision stages (steps 278-288) are repeated. If the incremented timer indicates (step 292) that the simulation is complete, results of the simulation are stored and/or displayed (step 294).

1. Boundary Conditions for Surface

To correctly simulate interactions with a surface, each facet must meet four boundary conditions. First, the combined mass of particles received by a facet must equal the combined mass of particles transferred by the facet (i.e., the net mass flux to the facet must equal zero). Second, the combined energy of particles received by a facet must equal the combined energy of particles transferred by the facet (i.e., the net energy flux to the facet must equal zero). These two conditions may be satisfied by requiring the net mass flux at each energy level (i.e., energy levels one and two) to equal zero.

The other two boundary conditions are related to the net momentum of particles interacting with a facet. For a surface with no skin friction, referred to herein as a slip surface, the net tangential momentum flux must equal zero and the net normal momentum flux must equal the local pressure at the facet. Thus, the components of the combined received and transferred momentums that are perpendicular to the normal na of the facet (i.e., the tangential components) must be equal, while the difference between the components of the combined received and transferred momentums that are parallel to the normal na of the facet (i.e., the normal components) must equal the local pressure at the facet. For non-slip surfaces, friction of the surface reduces the combined tangential momentum of particles transferred by the facet relative to the combined tangential momentum of particles received by the facet by a factor that is related to the amount of friction.

2. Gather From Voxels to Facets

As a first step in simulating interaction between particles and a surface, particles are gathered from the voxels and provided to the facets (step 278). As noted above, the flux of state i particles between a voxel N(x) and a facet $F_\alpha$ is:

$$\Gamma_{i\alpha}(x) = N_i(x) V_{i\alpha}(x). \qquad \text{Eq.(I11)}$$

From this, for each state i directed toward a facet $F_\alpha(c_i n_\alpha < 0)$, the number of particles provided to the facet $F_\alpha$ by the voxels is:

$$\Gamma_{i\alpha V \to F} = \Sigma_x \Gamma_{i\alpha}(x) = \Sigma_x N_i(x) V_{i\alpha}(x) \qquad \text{Eq.(I12)}$$

Only voxels for which $V_{i\alpha}(x)$ has a non-zero value must be summed. As noted above, the size of the facets is selected so that $V_{i\alpha}(x)$ has a non-zero value for only a small number of voxels. Because $V_{i\alpha}(x)$ and $P_f(x)$ may have non-integer values, $\Gamma_\alpha(x)$ is stored and processed as a real number.

3. Move From Facet to Facet

Figure 19:
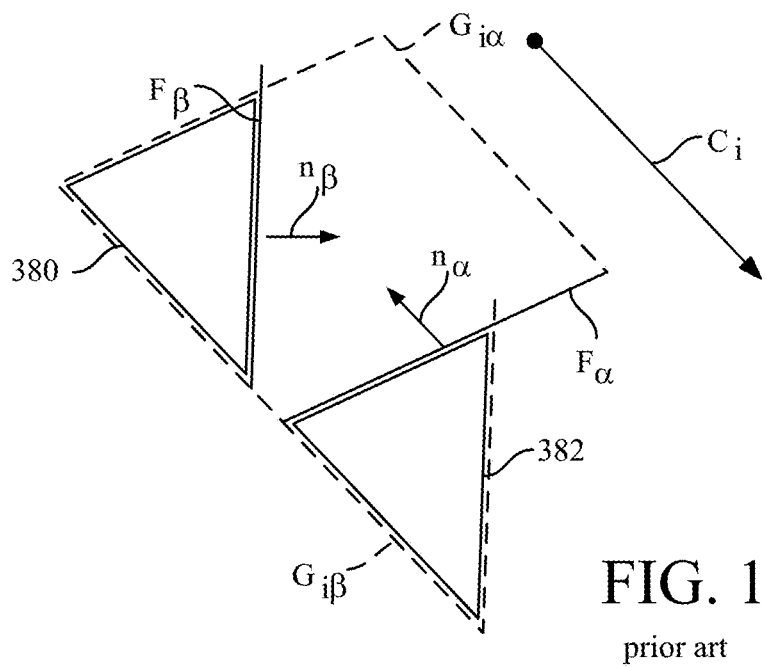
FIG. 19 is a flow chart of a procedure for performing surface dynamics (prior art).
Figure 18:
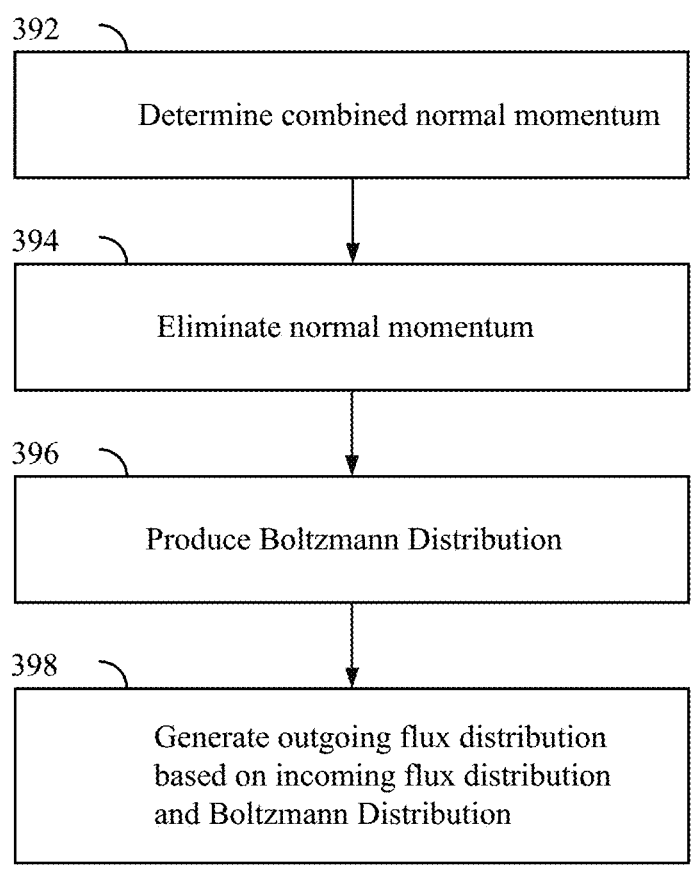
FIG. 18 illustrates a flow chart for surface dynamics (prior art).

Next, particles are moved between facets (step 280). If the parallelepiped $G_{i\alpha}$ for an incoming state $(c_i n_\alpha < 0)$ of a facet $F_\alpha$ is intersected by another facet $F_\beta$, then a portion of the state i particles received by the facet $F_\alpha$ will come from the facet $F_\beta$. In particular, facet $F_\alpha$ will receive a portion of the state i particles produced by facet $F_\beta$ during the previous time increment. This relationship is illustrated in FIG. 19, where a portion 380 of the parallelepiped $G_{i\alpha}$ that is intersected by facet $F_\beta$ equals a portion 382 of the parallelepiped $G_{i\beta}$ that is intersected by facet $F_\alpha$. As noted above, the intersected portion is denoted as $V_{i\alpha}(\beta)$. Using this term, the flux of state i particles between a facet $F_\beta$ and a facet $F_\alpha$ may be described as:

$$\Gamma_{i\alpha}(\beta, t-1) = \Gamma_i(\beta) V_{i\alpha}(\beta) / V_{i\alpha} \qquad \text{Eq.(I.13)}$$

where $\Gamma_i(\beta, t-1)$ is a measure of the state i particles produced by the facet $F_\beta$ during the previous time increment. From this, for each state i directed toward a facet $F_\alpha(c_i n_\alpha < 0)$, the number of particles provided to the facet $F_\alpha$ by the other facets is:

$$\gamma_{i\alpha F \to F} = \Sigma_\beta \Gamma_{i\alpha}(\beta) = \Sigma_\beta \Gamma_i(\beta, t-1) V_{i\alpha}(\beta) / V_{i\alpha} \qquad \text{Eq.(I.14)}$$

and the total flux of state i particles into the facet is:

$$\Gamma_{iIN}(\alpha) = \Gamma_{i\alpha F \to F} \Gamma_{i\alpha F \to F} = \Sigma_x N_i(x) V_{i\alpha} \Sigma_\beta \Gamma_i(\beta, t-1) V_{i\alpha}(\beta) / V_{i\alpha} \qquad \text{Eq. (I.15)}$$

The state vector $N(\alpha)$ for the facet, also referred to as a facet distribution function, has M entries corresponding to the M entries of the voxel states vectors. M is the number of discrete lattice speeds. The input states of the facet distribution function $N(\alpha)$ are set equal to the flux of particles into those states divided by the volume $V_{i\alpha}$:

$$N_i(\alpha) = \Gamma_{i1N}(\alpha) / V_{i\alpha} \qquad \text{Eq.(I.16)}$$

for $c_i n_\alpha < 0$.

The facet distribution function is a simulation tool for generating the output flux from a facet, and is not necessarily representative of actual particles. To generate an accurate output flux, values are assigned to the other states of the distribution function. Outward states are populated using the technique described above for populating the inward states:

$$n_i(\alpha) = \Gamma_{iOTHER}(\alpha) / V_{i\alpha} \qquad \text{Eq.(I.17)}$$

for $c_i n_\alpha > 0$, wherein $\Gamma_{iOTHER}(\alpha)$ is determined using the technique described above for generating $\Gamma_{i1N}(\alpha)$, but applying the technique to states $(c_i n_\alpha > 0)$ other than incoming states $(c_i n_\alpha < 0)$. In an alternative approach, $\Gamma_{iOTHER}(\alpha)$ may be generated using values of $\gamma_{iOUT}(\alpha)$ from the previous time step so that:

$$\Gamma_{iOTHER}(\alpha, t) = \Gamma_{iOUT}(\alpha, t-1) \qquad \text{Eq.(I.18)}$$

For parallel states $(c_i n_\alpha = 0)$, both $V_{i\alpha}$ and $V_{i\alpha}(x)$ are zero. In the expression for $N_i(\alpha)$, $V_{i\alpha}(x)$ appears in the numerator (from the expression for $\Gamma_{iOTHER}(\alpha)$ and $V_{i\alpha}$ appears in the denominator (from the expression for $N_i(\alpha)$). Accordingly, $N_i(\alpha)$ for parallel states is determined as the limit of $N_i(\alpha)$ as $V_{i\alpha}$ and $V_{i\alpha}(x)$ approach zero. The values of states having zero velocity (i.e., rest states and states (0, 0, 0, 2) and (0, 0, 0, -2)) are initialized at the beginning of the simulation based on initial conditions for temperature and pressure. These values are then adjusted over time.

4. Perform Facet Surface Dynamics

Next, surface dynamics are performed for each facet to satisfy the four boundary conditions discussed above (step 282). A procedure for performing surface dynamics for a facet is illustrated in FIG. 20. Initially, the combined momentum normal to the facet $F_\alpha$ is determined (step 392) by determining the combined momentum $P(\alpha)$ of the particles at the facet as:

$$P(\alpha) = \Sigma_i c_i^* N_i^\alpha \qquad \text{Eq.(I.19)}$$

for all i. From this, the normal momentum $P_n(\alpha)$ is determined as:

$$P_n(\alpha) = n_\alpha \cdot P(\alpha). \qquad \text{Eq.(I.20)}$$

This normal momentum is then eliminated using a pushing/pulling technique (step 394) to produce $N_{n-}(\alpha)$. According to this technique, particles are moved between states in a way that affects only normal momentum. The pushing/pulling technique is described in U.S. Pat. No. 5,594,671, which is incorporated by reference.

Thereafter, the particles of $N_{n-}(\alpha)$ are collided to produce a Boltzmann distribution $N_{n-\beta}(\alpha)$ (step 396). As described below with respect to performing fluid dynamics, a Boltzmann distribution may be achieved by applying a set of collision rules to $N_{n-}(\alpha)$.

An outgoing flux distribution for the facet $F_\alpha$ is determined (step 398) based on the incoming flux distribution and the Boltzmann distribution. First, the difference between the incoming flux distribution $\Gamma_i(\alpha)$ and the Boltzmann distribution is determined as:

$$\Delta\Gamma_i(\alpha) = \Gamma_{i1N}(\alpha) - N_{n-\beta i}(\alpha) V_{i\alpha} \qquad \text{Eq. (I.21)}$$

Using this difference, the outgoing flux distribution is:

$$\Gamma_{iOUT}(\alpha) = N_{n-\beta i}(\alpha) V_{i\alpha} - \Delta\Gamma_i^*(\alpha), \qquad \text{Eq.(I.22)}$$

for $n_{60} c_i > 0$ and where i* is the state having a direction opposite to state i. For example, if state i is (1, 1, 0, 0), then state i* is (-1, -1, 0, 0). To account for skin friction and other factors, the outgoing flux distribution may be further refined to:

$$\Gamma_{iOUT}(\alpha) = N_{n-\beta i}(\alpha) V_{i\alpha} - \Delta\Gamma_i^*(\alpha) + C_f(n_\alpha \cdot c_i) - [N_{n-\beta i}^*(\alpha) - N_{n-\beta i}(\alpha)] V_{i\alpha} + (n_\alpha \cdot c_i)(t_{i\alpha} \cdot c_i) \Delta N_{j,1} V_{1\alpha} + (n_\alpha \cdot c_i)(t_{2\alpha} \cdot c_i) \Delta N_{j,2} V_{i\alpha} \qquad \text{Eq.(I.23)}$$

for $n_\alpha c_i > 0$, where $C_f$ is a function of skin friction, $t_{i\alpha}$ is a first tangential vector that is perpendicular to $n_\alpha$, $t_{2\alpha}$ is a second tangential vector that is perpendicular to both $n_\alpha$ and $t_{i\alpha}$, and $\Delta N_{j,1}$ and $\Delta N_{j,2}$ are distribution functions corresponding to the energy (j) of the state i and the indicated tangential vector. The distribution functions are determined according to:

$$\Delta N_{j,1,2} = -\frac{1}{2j^2}\left(n_\alpha \sum_i c_i c_i N_{n-Bi}(\alpha) \cdot t_{1,2\alpha}\right) \qquad \text{Eq. (I.24)}$$

where j equals 1 for energy level 1 states and 2 for energy level 2 states.

The functions of each term of the equation for $\Gamma_{iOUT}(\alpha)$ are as follows. The first and second terms enforce the normal momentum flux boundary condition to the extent that collisions have been effective in producing a Boltzmann distribution, but include a tangential momentum flux anomaly. The fourth and fifth terms correct for this anomaly, which may arise due to discreteness effects or non-Boltzmann structure due to insufficient collisions. Finally, the third term adds a specified amount of skin fraction to enforce a desired change in tangential momentum flux on the surface. Generation of the friction coefficient $C_f$ is described below. Note that all terms involving vector manipulations are geometric factors that may be calculated prior to beginning the simulation.

From this, a tangential velocity is determined as:

$$u_i(\alpha) = (P(\alpha) - P_n(\alpha)n_\alpha)/\rho, \qquad \text{Eq.(I.25)}$$

where $\rho$ is the density of the facet distribution:

$$\rho = \sum_i N_i(\alpha) \qquad \text{Eq. (I.26)}$$

As before, the difference between the incoming flux distribution and the Boltzmann distribution is determined as:

$$\Delta\Gamma_i(\alpha) = \Gamma_{i1N}(\alpha) - N_{n-\beta i}(\alpha)V_{i\alpha}. \qquad \text{Eq.(I.27)}$$

The outgoing flux distribution then becomes:

$$\Gamma_{iOUT}(\alpha) = N_{n-\beta i}(\alpha)V_{i\alpha} - \Delta\Gamma_i^*(\alpha) + C_f(n_\alpha c_i)[N_{n-\beta i}^*(\alpha) - N_{n-\beta i}(\alpha)]V_{i\alpha}, \qquad \text{Eq.(I.28)}$$

which corresponds to the first two lines of the outgoing flux distribution determined by the previous technique but does not require the correction for anomalous tangential flux.

Using either approach, the resulting flux-distributions satisfy all of the momentum flux conditions, namely:

$$\sum_{i,c_i \cdot n_\alpha > 0} c_i \Gamma_{i\alpha OUT} - \sum_{i,c_i \cdot n_\alpha < 0} c_i \Gamma_{i\alpha IN} = \rho_\alpha n_\alpha A_\alpha - C_i \rho_\alpha u_i A_\alpha \qquad \text{(Eq. I.29)}$$

where $p_\alpha$ is the equilibrium pressure at the facet $F_\alpha$ and is based on the averaged density and temperature values of the voxels that provide particles to the facet, and $u_\alpha$ is the average velocity at the facet.

To ensure that the mass and energy boundary conditions are met, the difference between the input energy and the output energy is measured for each energy level j as:

$$\Delta\Gamma_{\alpha m j} = \sum_{i,c_{ji} \cdot n_\alpha < 0} \Gamma_{\alpha j i I N} - \sum_{i,c_{ji} \cdot n_\alpha > 0} \Gamma_{\alpha j i O U T} \qquad \text{Eq. (I.30)}$$

where the index j denotes the energy of the state i. This energy difference is then used to generate a difference term:

$$\Delta\Gamma_{\alpha j i} = V_{i\alpha} \Delta\Gamma_{\alpha m j'} \sum_{i,c_{ji} \cdot n_\alpha < 0} V_{i\alpha} \qquad \text{Eq. (I.31)}$$

for $c_{ji} n_\alpha > 0$. This difference term is used to modify the outgoing flux so that the flux becomes:

$$\Gamma_{\alpha j i O U T f} = \Gamma_{\alpha j i O U T} \delta\Gamma_{\alpha j i} \qquad \text{Eq.(I.32)}$$

for $c_{ji} n_\alpha > 0$. This operation corrects the mass and energy flux while leaving the tangential momentum flux unaltered. This adjustment is small if the flow is approximately uniform in the neighborhood of the facet and near equilibrium. The resulting normal momentum flux, after the adjustment, is slightly altered to a value that is the equilibrium pressure based on the neighborhood mean properties plus a correction due to the non-uniformity or non-equilibrium properties of the neighborhood.

5. Move From Voxels to Voxels

Referring again to FIG. 11, particles are moved between voxels along the three-dimensional rectilinear lattice (step 284). This voxel to voxel movement is the only movement operation performed on voxels that do not interact with the facets (i.e., voxels that are not located near a surface). In typical simulations, voxels that are not located near enough to a surface to interact with the surface constitute a large majority of the voxels.

Each of the separate states represents particles moving along the lattice with integer speeds in each of the three dimensions: x, y, and z. The integer speeds include: 0, ±1, and ±2. The sign of the speed indicates the direction in which a particle is moving along the corresponding axis.

For voxels that do not interact with a surface, the move operation is computationally quite simple. The entire population of a state is moved from its current voxel to its destination voxel during every time increment. At the same time, the particles of the destination voxel are moved from that voxel to their own destination voxels. For example, an energy level 1 particle that is moving in the +1x and +1y direction (1, 0, 0) is moved from its current voxel to one that is +1 over in the x direction and 0 for other direction. The particle ends up at its destination voxel with the same state it had before the move (1,0,0). Interactions within the voxel will likely change the particle count for that state based on local interactions with other particles and surfaces. If not, the particle will continue to move along the lattice at the same speed and direction.

The move operation becomes slightly more complicated for voxels that interact with one or more surfaces. This can result in one or more fractional particles being transferred to a facet. Transfer of such fractional particles to a facet results in fractional particles remaining in the voxels. These fractional particles are transferred to a voxel occupied by the facet.

Referring to FIG. 17, when a portion 360 of the state i particles for a voxel 362 is moved to a facet 364 (step 278), the remaining portion 366 is moved to a voxel 368 in which the facet 364 is located and from which particles of state i are directed to the facet 364. Thus, if the state population equaled 25 and $V_{i\alpha}(x)$ equaled 0.25 (i.e., a quarter of the voxel intersects the parallelepiped $G_{i\alpha}$), then 6.25 particles would be moved to the facet $F_\alpha$ and 18.75 particles would be moved to the voxel occupied by the facet $F_\alpha$. Because multiple facets could intersect a single voxel, the number of state i particles transferred to a voxel N(f) occupied by one or more facets is:

$$N_i(f) = N_i(x)\left(1 - \sum_{\alpha} V_{i\alpha}(x)\right) \quad \text{Eq. (I.33)}$$

where N(x) is the source voxel.

6. Scatter From Facets to Voxels

Next, the outgoing particles from each facet are scattered to the voxels (step 286). Essentially, this step is the reverse of the gather step by which particles were moved from the voxels to the facets. The number of state i particles that move from a facet Fa to a voxel N(x) is:

$$N_{\alpha iF \to V} = \frac{1}{P_f(x)} V_{i\alpha}(x) \Gamma_{\alpha i OUT_f} / V_{\alpha i} \quad \text{Eq. (I.34)}$$

where $P_f(x)$ accounts for the volume reduction of partial voxels. From this, for each state i, the total number of particles directed from the facets to a voxel $N_{(x)}$ is:

$$N_{iF \to V} = \frac{1}{P_f(x)} \sum_{\alpha} V_{\alpha i}(x) \Gamma_{\alpha i OUT_f} / V_{\alpha i} \quad \text{Eq. (I.35)}$$

After scattering particles from the facets to the voxels, combining them with particles that have advected in from surrounding voxels, and integerizing the result, it is possible that certain directions in certain voxels may either underflow (become negative) or overflow (exceed 255 in an eight-bit implementation). This would result in either a gain or loss in mass, momentum and energy after these quantities are truncated to fit in the allowed range of values. To protect against such occurrences, the mass, momentum and energy that are out of bounds are accumulated prior to truncation of the offending state. For the energy to which the state belongs, an amount of mass equal to the value gained (due to underflow) or lost (due to overflow) is added back to randomly (or sequentially) selected states having the same energy and that are not themselves subject to overflow or underflow. The additional momentum resulting from this addition of mass and energy is accumulated and added to the momentum from the truncation. By only adding mass to the same energy states, both mass and energy are corrected when the mass counter reaches zero. Finally, the momentum is corrected using pushing/pulling techniques until the momentum accumulator is returned to zero.

7. Perform Fluid Dynamics

Fluid dynamics are performed (step 288) FIG. 11. This step may be referred to as microdynamics or intravoxel operations. Similarly, the advection procedure may be referred to as intervoxel operations. The microdynamics operations described below may also be used to collide particles at a facet to produce a Boltzmann distribution.

The fluid dynamics is ensured in the lattice Boltzmann equation models by a particular collision operator known as the BGK collision model. This collision model mimics the dynamics of the distribution in a real fluid system. The collision process can be well described by the right-hand side of Equation 1 and Equation 2. After the advection step, the conserved quantities of a fluid system, specifically the density, momentum and the energy are obtained from the distribution function using Equation 3. From these quantities, the equilibrium distribution function, noted by $f^{eq}$ in equation (2), is fully specified by Equation (4). The choice of the velocity vector set $c_i$, the weights, both are listed in Table 1, together with Equation 2 ensures that the macroscopic behavior obeys the correct hydrodynamic equation.

Variable Resolution

Variable resolution (as discussed in US 2013/0151221 A1) can also be employed and would use voxels of different sizes, e.g., coarse voxels and fine voxels.

By leveraging the unique transient Lattice Boltzmann-based physics, the system can perform simulations that accurately predict real-world conditions. For example, engineers evaluate product performance early in the design process before any prototype being built, when the impact of the change is most significant for design and budgets. The system can use the CAD geometry to accurately and efficiently performs aerodynamic, aero-acoustic and thermal management simulations. The system can perform simulations to address such applications as: aerodynamics (aerodynamic efficiency; vehicle handling; soiling and water management; panel deformation; driving dynamics), aeroacoustics (greenhouse wind noise; underbody wind noise; gap/seal noise; mirror, whistle and tonal noise; sunroof and window buffeting; pass-by/community noise; cooling fan noise), thermal management (cooling airflow; thermal protection; brake cooling; drive cycle simulation; key-off and soak; electronics and battery cooling; ROA/intake ports), climate control (cabin comfort; HVAC unit & distribution system performance; HVAC system and fan noise; defrost and demist), powertrain: (drivetrain cooling; exhaust systems; cooling jacket; engine block), soiling and water management (a pillar overflow, dirt and dust accumulation, tire spray).

Embodiments of the subject matter and the functional operations described in this specification can be implemented in digital electronic circuitry, tangibly-embodied computer software or firmware, computer hardware (including the structures disclosed in this specification and their structural equivalents), or in combinations of one or more of them. Embodiments of the subject matter described in this specification can be implemented as one or more computer programs (i.e., one or more modules of computer program instructions encoded on a tangible non-transitory program carrier for execution by, or to control the operation of, data processing apparatus). The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way of example, a programmable processor, a computer, or multiple processors or computers. The apparatus can also be or further include special purpose logic circuitry (e.g., an FPGA (field programmable gate array) or an ASIC (application-specific integrated circuit)). In addition to hardware, the apparatus can optionally include code that creates an execution environment for computer programs (e.g., code that constitutes processor firmware, a protocol stack, a database management system, an operating system, or a combination of one or more of them).

A computer program, which can also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or another unit suitable for use in a computing environment. A computer program may, but need not, correspond to a file in a file system. A program can be stored in a portion of a file that holds other programs or data (e.g., one or more scripts stored in a markup language document, in a single file dedicated to the program in question, or in multiple coordinated files (e.g., files that store one or more modules, subprograms, or portions of code)). A computer program can be deployed so that the program is executed on one computer or on multiple computers that are located at one site or distributed across multiple sites and interconnected by a data communication network.

Computers suitable for the execution of a computer program can be based on general or special purpose microprocessors or both, or any other kind of central processing unit. Computer-readable media suitable for storing computer program instructions and data include all forms of nonvolatile memory on media and memory devices, including by way of example semiconductor memory devices (e.g., EPROM, EEPROM, and flash memory devices), magnetic disks (e.g., internal hard disks or removable disks), magneto-optical disks, and CD-ROM and DVD-ROM disks. The processor and the memory can be supplemented by, or incorporated in, special purpose logic circuitry.

Embodiments of the subject matter described in this specification can be implemented in a computing system that includes a back-end component (e.g., as a data server), or that includes a middleware component (e.g., an application server), or that includes a front-end component (e.g., a client computer having a graphical user interface or a web browser through which a user can interact with an implementation of the subject matter described in this specification), or any combination of one or more such back-end, middleware, or front-end components. The components of the system can be interconnected by any form or medium of digital data communication (e.g., a communication network). Examples of communication networks include a local area network (LAN) and a wide area network (WAN) (e.g., the Internet).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a user device (e.g., for purposes of displaying data to and receiving user input from a user interacting with the user device), which acts as a client. Data generated at the user device (e.g., a result of the user interaction) can be received from the user device at the server.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing can be advantageous.

What is claimed is:

1. A computer-implemented method comprising:
   selecting by a computing system, a first set of points on a first solid in a computer aided design (CAD) generated drawing;
   identifying a second set of points on a second solid in the CAD generated drawing;
   identifying at least one gap between at least one first point in the first set of points and at least one second point in the second set of points by applying a Delaunay mesh of tetrahedrons of the first set of points and the second set of points to the at least one gap;
   classifying the at least one gap between the first point and the second point as either a significant gap or an insignificant gap.

2. The computer-implemented method of claim 1 wherein classifying the gap further comprises:
   determining a set of criteria representative of the at least one gap;
   comparing the determined criteria to threshold values for the criteria; and
   classifying the at least one gap according to comparison of the determined criteria with the threshold values.

3. The computer-implemented method of claim 1 wherein the criteria include a length value corresponding to a physical distance between the first point and the second point and an angular value that represents an angle formed by an intersection of two rays normal to the surfaces of each of the first and second solids at the respective first point and second point.

4. The computer-implemented method of claim 1 wherein identifying at least one gap, further comprises:
   determining a volume of the identified at least one gap between the first solid and the second solid by applying to the at least one gap the Delaunay three dimensional mesh comprised of tetrahedrons such that no point of the first set of points that includes the first point and the second set of points that includes the second point are inside of the volume of a given one of the tetrahedrons.

5. The computer-implemented method of claim 4, further comprising excluding at least one tetrahedron of the tetrahedrons of the Delaunay three dimensional mesh from the volume based on the length of an edge that touches both the first solid and the second solid.

6. The computer-implemented method of claim 4, further comprising excluding at least one tetrahedron of the tetrahedrons of the Delaunay three dimensional mesh from the volume based on a vertex angle of an isosceles triangle where the base of the isosceles triangle is an edge of the tetrahedron and one side of the isosceles triangle is normal to the surface of the first solid.

7. The computer-implemented method of claim 4, further comprising excluding at least one tetrahedron of the tetrahedrons of the Delaunay three dimensional mesh from the volume based on a vertex angle of an isosceles triangle where the base of the isosceles triangle is an edge of the tetrahedron and one side of the isosceles triangle is normal to the surface of the first solid.

8. The computer-implemented method of claim 1, further comprising:
   filling at least the at least one gap classified as significant in the CAD generated drawing with a fill shape to provide a corrected CAD generated drawing.

9. The computer-implemented method of claim 8 wherein the gap fill process identifies a union of multi-solids that satisfy user defined criterion to fill the at least one gap.

10. The computer-implemented method of claim 9 wherein the corrected CAD generated drawing is a representation of a physical object, with the method further comprising:
    generating from the corrected CAD generated drawing a model of a simulation space including a lattice structure represented as a collection of voxels, with the voxels having appropriate resolutions to account for surfaces of the physical object; and simulating, by the one or more computer systems a fluid flow in the simulation space.

11. A system comprises:

one or more processing devices;

memory operatively coupled to the one or more processor devices; and one or more storage devices storing instructions that are operable, when executed by the one or more processing devices, to configure the system to:

identify a first set of points on a first solid in a computer aided design (CAD) generated drawing of a physical object;

identify a second set of points on the second solid in the CAD design;

identify a gap between the first solid and the second solid to determine a volume of the gap by applying a Delaunay mesh of tetrahedrons of the first set of points and the second set of points to the gap.

12. The system of claim 11 wherein the system configured to determine the volume of the gap is further configured to:

identify tetrahedrons of the Delaunay mesh, which have corners that touch each of the first solid and the second solid.

13. The system of claim 12, further configured to:

exclude at least one tetrahedron of the tetrahedrons of the Delaunay mesh from the volume based on the length of an edge that touches both the first solid and the second solid.

14. The system of claim 12, further configured to:

exclude at least one tetrahedron from the volume based on a vertex angle of an isosceles triangle where the base of the isosceles triangle is an edge of the tetrahedron and one side of the isosceles triangle is normal to the surface of the first solid.

15. The system of claim 11, further configured to:

classify the gap as significant or insignificant and when classified as significant, fill at least the gap classified as significant in the CAD generated drawing with a fill shape to provide a corrected CAD generated drawing, which is a union of multi-solids that satisfy user defined criterion to fill the gap.

16. The system of claim 15 wherein the corrected CAD generated drawing is a representation of a physical object, with the system further configured to:

generate from the corrected CAD generated drawing a model of a simulation space including a lattice structure represented as a collection of voxels, with the voxels having appropriate resolutions to account for surfaces of the physical object; and simulate a fluid flow in the simulation space.

17. A computer program product tangibly stored on a non-transitory hardware storage device for identifying gaps in a computer aided design figure, the computer program product comprising instructions that are operable, when executed by a system to cause the system to:

identify a first set of points on a first solid in a CAD design;

identify a second set of points on the second solid in the CAD design;

identify a gap between the first solid and the second solid to determine a volume of the gap by applying a Delaunay three dimensional tetrahedral mesh of the first set of points and the second set of points to the gap.

18. The computer program product of claim 17 wherein the instructions to determine the volume of the gap further comprise instructions to:

identify tetrahedrons of the Delaunay mesh that have corners that touch each of the first solid and the second solid.

19. The computer program product of claim 18 wherein the instructions to determine the volume of the gap further comprise instructions to:

exclude at least one tetrahedron from the volume based on the length of an edge that touches both the first solid and the second solid.

20. The computer program product of claim 18 wherein the instructions to determine the volume of the gap further comprise instructions to:

exclude at least one tetrahedron from the volume based on a vertex angle of an isosceles triangle where the base of the isosceles triangle is an edge of the tetrahedron and one side of the isosceles triangle is normal to the surface of the first solid.

\* \* \* \* \*